(12) United States Patent
Jiang et al.

(10) Patent No.: US 10,767,817 B2
(45) Date of Patent: Sep. 8, 2020

(54) LED LIGHT BULB AND LED FILAMENT THEREOF

(71) Applicant: JIAXING SUPER LIGHTING ELECTRIC APPLIANCE CO., LTD, Jiaxing (CN)

(72) Inventors: Tao Jiang, Jiaxing (CN); Liqin Li, Jiaxing (CN)

( * ) Notice: Subject to any disclaimer, the term of this patent is extended or adjusted under 35 U.S.C. 154(b) by 0 days.

(21) Appl. No.: 16/701,170

(22) Filed: Dec. 3, 2019

(65) Prior Publication Data

US 2020/0103081 A1 Apr. 2, 2020

Related U.S. Application Data

(63) Continuation of application No. 16/259,982, filed on Jan. 28, 2019, now Pat. No. 10,527,233, which is a
(Continued)

(30) Foreign Application Priority Data

Aug. 17, 2015 (CN) .......................... 2015 1 0502630
Dec. 19, 2015 (CN) .......................... 2015 1 0966906
(Continued)

(51) Int. Cl.
*F21K 9/232* (2016.01)
*H01L 25/075* (2006.01)
(Continued)

(52) U.S. Cl.
CPC ................ *F21K 9/232* (2016.08); *F21K 9/64* (2016.08); *H01L 25/0753* (2013.01);
(Continued)

(58) Field of Classification Search
CPC ..................... F21K 9/232–237; H01L 25/0753
See application file for complete search history.

(56) References Cited

U.S. PATENT DOCUMENTS 7,399,429 B2 7/2008 Liu et al.
7,482,059 B2 1/2009 Peng et al.
(Continued)

FOREIGN PATENT DOCUMENTS

CN 201448620 U 5/2010
CN 101826588 A 9/2010
(Continued)

*Primary Examiner* — Sean P Gramling
(74) *Attorney, Agent, or Firm* — Simon Kuang Lu

(57) ABSTRACT

An LED light bulb, comprising: a bulb shell with a lower part and an upper part opposite to the lower part; a bulb base connected with the bulb shell; a heat dissipating element connected with the lower part of the bulb shell and the bulb base, wherein the height of the heat dissipating element is L1 and the maximum height from the heat dissipating element to the upper part of the bulb shell is L2, and the ratio of L1 to L2 is from 1/30 to 1/3; and an LED filament with a plurality of LED chips electrically connected to each other disposed in the bulb shell, two conductive supports, disposed in the bulb shell, a driving circuit, electrically connected with the two conductive supports and the bulb base, a stem disposed in the bulb shell, the LED filament is connected with the stem through the conductive supports.

19 Claims, 24 Drawing Sheets

Related U.S. Application Data continuation of application No. 15/237,983, filed on Aug. 16, 2016, now Pat. No. 10,228,093.

(30) Foreign Application Priority Data

| | | |
|---|---|---|
| Jan. 22, 2016 | (CN) | 2016 1 0041667 |
| Apr. 27, 2016 | (CN) | 2016 1 0272153 |
| Apr. 29, 2016 | (CN) | 2016 1 0281600 |
| Jun. 3, 2016 | (CN) | 2016 1 0394610 |
| Jul. 22, 2016 | (CN) | 2016 1 0586388 |

(51) Int. Cl.

| | |
|---|---|
| H01L 33/62 | (2010.01) |
| F21K 9/64 | (2016.01) |
| F21V 3/02 | (2006.01) |
| F21K 9/238 | (2016.01) |
| F21K 9/90 | (2016.01) |
| F21V 19/00 | (2006.01) |
| F21Y 115/10 | (2016.01) |
| F21Y 103/33 | (2016.01) |
| F21Y 103/37 | (2016.01) |
| F21Y 107/00 | (2016.01) |
| H01L 33/50 | (2010.01) |
| F21V 3/06 | (2018.01) |

(52) U.S. Cl.

CPC .......... *H01L 33/62* (2013.01); *F21K 9/238* (2016.08); *F21K 9/90* (2013.01); *F21V 3/02* (2013.01); *F21V 3/061* (2018.02); *F21V 3/062* (2018.02); *F21V 19/003* (2013.01); *F21Y 2103/33* (2016.08); *F21Y 2103/37* (2016.08); *F21Y 2107/00* (2016.08); *F21Y 2115/10* (2016.08); *H01L 33/501* (2013.01); *H01L 2224/45014* (2013.01); *H01L 2224/48137* (2013.01)

(56) References Cited

U.S. PATENT DOCUMENTS

| | | | |
|---|---|---|---|
| 8,455,895 | B2 | 6/2013 | Chai et al. |
| 8,933,619 | B1 | 1/2015 | Ou |
| 9,016,900 | B2 | 4/2015 | Takeuchi et al. |
| 9,360,188 | B2 | 6/2016 | Kircher et al. |
| 9,488,767 | B2 | 11/2016 | Nava et al. |
| 9,761,765 | B2 | 9/2017 | Basin et al. |
| 9,982,854 | B2 | 5/2018 | Ma et al. |
| 2004/0008525 | A1 | 1/2004 | Shibata |
| 2007/0267976 | A1 | 11/2007 | Bohler et al. |
| 2009/0184618 | A1 | 7/2009 | Hakata et al. |
| 2010/0135009 | A1 | 6/2010 | Duncan et al. |
| 2012/0119647 | A1 | 5/2012 | Hsu |
| 2012/0162965 | A1 | 6/2012 | Takeuchi et al. |
| 2012/0281411 | A1 | 11/2012 | Kajiya et al. |
| 2013/0003346 | A1 | 1/2013 | Letoquin et al. |
| 2013/0058080 | A1 | 3/2013 | Ge et al. |
| 2013/0058580 | A1 | 3/2013 | Ge et al. |
| 2013/0147348 | A1 | 6/2013 | Motoya et al. |
| 2013/0235592 | A1 | 9/2013 | Takeuchi et al. |
| 2013/0265796 | A1 | 10/2013 | Kwisthout |
| 2013/0293098 | A1 | 11/2013 | Li et al. |
| 2014/0185269 | A1 | 7/2014 | Li |
| 2014/0218892 | A1 | 8/2014 | Edwards et al. |
| 2014/0268779 | A1 | 9/2014 | Sorensen et al. |
| 2014/0369036 | A1 | 12/2014 | Feng |
| 2015/0022114 | A1 | 1/2015 | Kim |
| 2015/0069442 | A1 | 3/2015 | Liu et al. |
| 2015/0070871 | A1 | 3/2015 | Chen et al. |
| 2015/0211723 | A1 | 7/2015 | Athalye |
| 2015/0255440 | A1 | 9/2015 | Hsieh |
| 2016/0238199 | A1 | 8/2016 | Yeung et al. |
| 2016/0369952 | A1 | 12/2016 | Weekamp |
| 2016/0377237 | A1 | 12/2016 | Ge |
| 2017/0012177 | A1* | 1/2017 | Trottier .............. H01L 25/0753 |
| 2017/0016582 | A1 | 1/2017 | Yang et al. |
| 2017/0138542 | A1 | 5/2017 | Gielen et al. |
| 2017/0167663 | A1 | 6/2017 | Hsiao et al. |
| 2017/0167711 | A1 | 6/2017 | Kadijk |
| 2019/0137047 | A1 | 5/2019 | Hu |
| 2019/0277484 | A1 | 9/2019 | Kwisthout |

FOREIGN PATENT DOCUMENTS

| | | |
|---|---|---|
| CN | 102121576 A | 7/2011 |
| CN | 202209551 U | 5/2012 |
| CN | 202252991 U | 5/2012 |
| CN | 202253168 U | 5/2012 |
| CN | 102751274 A | 10/2012 |
| CN | 202473919 U | 10/2012 |
| CN | 202719450 U | 2/2013 |
| CN | 101968181 B | 3/2013 |
| CN | 102969320 A | 3/2013 |
| CN | 202834823 U | 3/2013 |
| CN | 103123949 A | 5/2013 |
| CN | 203367275 U | 12/2013 |
| CN | 203367375 U | 12/2013 |
| CN | 103560128 A | 2/2014 |
| CN | 103682042 A | 3/2014 |
| CN | 203477967 U | 3/2014 |
| CN | 103890481 A | 6/2014 |
| CN | 203628311 U | 6/2014 |
| CN | 203628391 U | 6/2014 |
| CN | 203628400 U | 6/2014 |
| CN | 203656627 U | 6/2014 |
| CN | 203671312 U | 6/2014 |
| CN | 103939758 A | 7/2014 |
| CN | 103956421 A | 7/2014 |
| CN | 103972364 A | 8/2014 |
| CN | 103994349 A | 8/2014 |
| CN | 203771136 U | 8/2014 |
| CN | 203857313 U | 10/2014 |
| CN | 203880468 U | 10/2014 |
| CN | 203907265 U | 10/2014 |
| CN | 203910792 U | 10/2014 |
| CN | 203932049 U | 11/2014 |
| CN | 204062539 U | 12/2014 |
| CN | 104295945 A | 1/2015 |
| CN | 104319345 A | 1/2015 |
| CN | 204083941 U | 1/2015 |
| CN | 204153513 U | 2/2015 |
| CN | 104456165 A | 3/2015 |
| CN | 204289439 U | 4/2015 |
| CN | 104600174 A | 5/2015 |
| CN | 104600181 A | 5/2015 |
| CN | 204328550 U | 5/2015 |
| CN | 104716247 A | 6/2015 |
| CN | 204387765 U | 6/2015 |
| CN | 104913217 A | 9/2015 |
| CN | 104979455 A | 10/2015 |
| CN | 105042354 A | 11/2015 |
| CN | 105090789 A | 11/2015 |
| CN | 105098032 A | 11/2015 |
| CN | 105140381 A | 12/2015 |
| CN | 105161608 A | 12/2015 |
| CN | 204986570 U | 1/2016 |
| CN | 105371243 A | 3/2016 |
| CN | 205081145 U | 3/2016 |
| CN | 105609621 A | 5/2016 |
| CN | 106468405 A | 3/2017 |
| CN | 106898681 A | 6/2017 |
| CN | 107123641 A | 9/2017 |
| CN | 107170733 A | 9/2017 |
| CN | 206563190 U | 10/2017 |
| CN | 107314258 A | 11/2017 |
| CN | 206973307 U | 2/2018 |
| CN | 207034659 U | 2/2018 |
| CN | 108039402 A | 5/2018 |
| CN | 105090782 B | 7/2018 |
| CN | 207849021 U | 9/2018 |
| CN | 209354987 U | 9/2019 |

(56) References Cited

FOREIGN PATENT DOCUMENTS

| | | |
|---|---|---|
| EP | 2535640 A1 | 12/2012 |
| EP | 2760057 A1 | 7/2014 |
| EP | 2567145 B1 | 4/2016 |
| GB | 2547085 A | 8/2017 |
| JP | 3075689 U | 2/2001 |
| JP | 2001126510 A | 5/2001 |
| JP | 2003037239 A | 2/2003 |
| JP | 2006202500 A | 8/2006 |
| JP | 2013225587 A | 10/2013 |
| WO | 2012053134 A1 | 4/2012 |
| WO | 2014012346 A1 | 1/2014 |
| WO | 2014167458 A1 | 10/2014 |
| WO | 2017037010 A1 | 3/2017 |

\* cited by examiner

LED LIGHT BULB AND LED FILAMENT THEREOF

CROSS-REFERENCE TO RELATED APPLICATIONS

This application is a continuation application of U.S. patent application Ser. No. 16/259,982 filed on 2019 Jan. 28, which is a continuation application of U.S. patent application Ser. No. 15/237,983 filed on 2016 Aug. 16, which claims priority to Chinese Patent Applications No: 201510502630.3 filed on 2015 Aug. 17; No. 201510966906.3 filed on 2015 Dec. 19; No. 201610041667.5 filed on 2016 Jan. 22; No. 201610272153.0 filed on 2016 Apr. 27; No. 201610281600.9 filed on 2016 Apr. 29; No. 201610394610.3 field on 2016 Jun. 3 and No. 201610586388.7 filed on 2016 Jul. 22, each of which is hereby incorporated by reference in its entirety.

This application claims priority to Chinese Patent Applications No: 201510502630.3 filed on 2015 Aug. 17; No. 201510966906.3 filed on 2015 Dec. 19; No. 201610041667.5 filed on 2016 Jan. 22; No. 201610272153.0 filed on 2016 Apr. 27; No. 201610281600.9 filed on 2016 Apr. 29; No. 201610394610.3 field on 2016 Jun. 3 and No. 201610586388.7 filed on 2016 Sep. 22, each of which is hereby incorporated by reference in its entirety.

TECHNICAL FIELD

The instant disclosure relates to illumination field, and more particularly, to an LED light bulb and an LED filament thereof.

RELATED ART

The LED has advantages of environmental protection, energy saving, high efficiency and long lifespan, and therefore it attracts widespread attention in recent years and gradually replaces traditional lighting lamps. However, due that the luminescence of the LED has directivity, current LED lamps is unable to provide with an illumination with a wide angle range like traditional lamps. Accordingly, how to design LED lamps with similar wide range for illumination to the traditional lamps challenges the industries.

In order to provide with an illumination with a wide range, optical components like lenses, prisms, reflectors are utilized to adjust light distribution emitted originally from the LED. However, the optical components for adjusting the light distribution decrease the overall optical efficiency of LED lamps. Consequently, how to improve the optical efficiency and provide with wide range for illumination are important tasks in the lighting industry.

Next, an LED die without package can be deemed as a full-angle light source and is capable of providing with full-range illumination. However, the package of LED narrows the illumination angle and decreases optical efficiency.

Further, a lamp with a LED filament is more possible to provide wide-range illumination and its outlook is closer to that of the traditional incandescent (tungsten) light bulbs. This is also one of advantages of light bulb with a LED filament.

One of the challenges of LED light bulbs is omnidirectional lighting. Current LED light bulbs utilize LED filaments. The LED filament has LED chips on a strip substrate and mixtures of silica gel with phosphor coated on the LED chips. The substrate is usually a glass substrate or a metal substrate. The glass substrate has the advantages of not blocking light emitted from LED chips; however, its disadvantages include that the thermal conductivity of the glass substrate is not good and the glass substrate is fragile. Likewise, the LED chips are disposed on the metal substrate having excellent thermal conductivity, but light emitted from the LED chips will be blocked from the metal substrate side. Additionally, the substrates of conventional LED filaments are hard and not bendable. Accordingly, in order to provide with omnidirectional lighting, the conventional LED light bulb utilizes a number of LED filaments symmetrically positioned inside a bulb shell. The utilization of multiple LED filaments increases the cost of the LED bulb because of its complicated manufacturing processes, complex assembly procedures and low yield rate. Additionally, the more LED filaments in a light bulb, the more soldering spots between filaments and filament supports there are as well as the higher possibility soldering defects happens.

US patent publication number 20130058080A1 discloses an LED light bulb and an LED light-emitting strip capable of emitting $4\pi$ light. The LED light bulb comprises an LED light bulb shell, a core column with an exhaust tube and a bracket, at least one LED light emitting strip with LED chips therein emitting $4\pi$ light, a driver, and an electrical connector. The LED light bulb shell is vacuum sealed with the core column so as to form a vacuum sealed chamber. The vacuum sealed chamber is filled with a gas having a low coefficient of viscosity and a high coefficient of thermal conductivity. The bracket and the LED light emitting strips fixed on the bracket are housed in the vacuum sealed chamber. The LED light emitting strip is in turn electrically connected to the driver, the electrical connector, while the electrical connector is used to be electrically connected to an external power supply, so as to light the LED light emitting strips.

SUMMARY

To address the issues, the instant disclosure provides with embodiments of an LED filament, a manufacturing method therefore, and an LED light bulb utilizing the LED filament.

According to an embodiment, an LED filament comprising a plurality of LED chips, at least two conductive electrodes disposed corresponding to the plurality of LED chips, and a light conversion coating. The plurality of LED chips and the conductive electrodes are electrically connected therebetween. The light conversion coating comprises an adhesive and a plurality of phosphors. The light conversion coating coats on at least two sides of the LED chips and the conductive electrodes. The light conversion coating exposes a portion of two of the conductive electrodes. The phosphors in the light conversion coating are capable of emitting light after absorbing some form of radiation.

According to an embodiment, the LED filament further comprises a plurality of conductive wires electrically and correspondingly connected among the plurality of LED chips and the conductive electrodes. The light conversion coating covers the plurality of conductive wires.

According to an embodiment, the LED filament further comprises a plurality of circuit films electrically and correspondingly connected among the plurality of LED chips and the conductive electrodes. The light conversion coating covers the plurality of the circuit films.

According to an embodiment, each of the circuit films comprises a first film and a conductive circuit disposed thereon. The conductive circuits are electrically and correspondingly connected among the plurality of LED chips and the conductive electrodes.

According to an embodiment, the light conversion coating comprises a base layer and a top layer. The plurality of LED chips is on a side of the base layer. The Shore D Hardness of the base layer is at least 60 HD.

According to an embodiment, the light conversion coating further comprises oxidized nanoparticles. The size of the oxidized nanoparticles is substantially smaller than the size of the phosphors.

According to an embodiment, the Young's Modulus of the LED filament is between $0.1 \times 10^{10}$ Pa to $0.3 \times 10^{10}$ Pa. The composition ratio of the plurality of the phosphors to the adhesive is between 1:1 and 99:1.

According to an embodiment, an LED light bulb comprises a bulb shell, a bulb base connected with the bulb shell, at least two conductive supports disposed in the bulb shell, and a single LED filament disposed in the light bulb. The LED filament comprises a plurality of LED chips, at least two conductive electrodes disposed corresponding to the plurality of LED chips, and a light conversion coating. The plurality of LED chips and the conductive electrodes are electrically connected therebetween. The conductive electrodes are electrically and respectively connected with the conductive supports. The light conversion coating coats on at least two sides of the LED chips and the conductive electrodes. The light conversion coating exposes a portion of two of the conductive electrodes. The light conversion coating comprises an adhesive and a plurality of phosphors.

According to an embodiment, the LED light bulb further comprises a stem in the bulb shell and a heat dissipating element between the bulb shell and bulb base. The heat dissipating element is connected with the stem. The LED filament connected with the stem.

According to some embodiments, each of the surfaces of the LED chips is covered by the light conversion coating. The phosphors of light conversion coating may absorb light out of the surfaces of the LED chips and emit light with longer wavelength. Since the LED chips are surrounded by the light conversion coating to form the main body of the LED filament, the LED filament is capable of emitting light from the sides of the filament having the light conversion coating, and being bended with adequate rigidity. The LED light bulb is capable of emitting omnidirectional light with the single LED filament.

DETAILED DESCRIPTION

Figure 1:
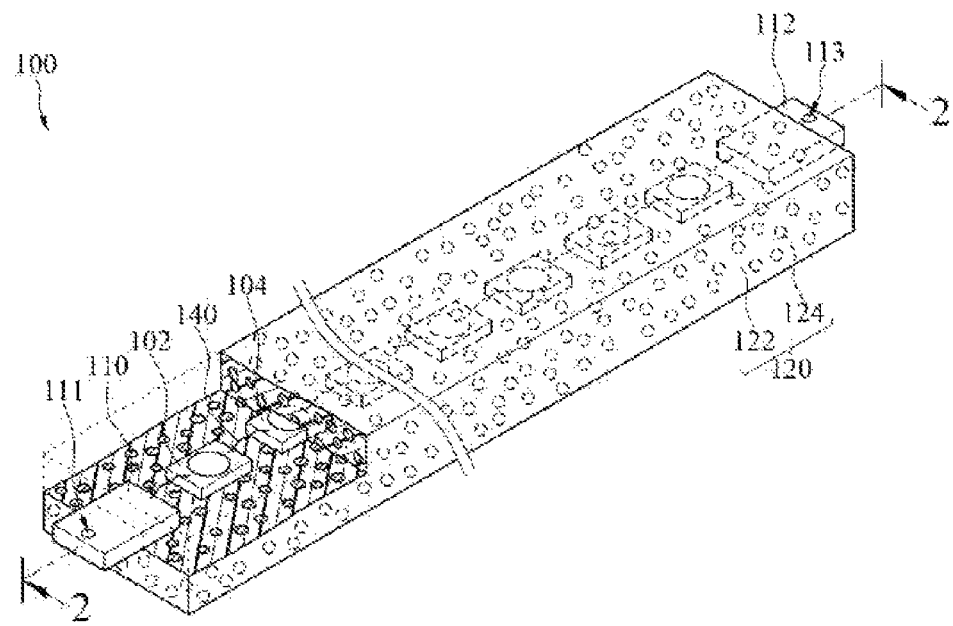
FIG. 1 illustrates a perspective view of an LED light bulb with partial sectional view according to a first embodiment of the LED filament.

The instant disclosure provides an LED filament and an LED light bulb to solve the abovementioned problems. The instant disclosure will now be described more fully hereinafter with reference to the accompanying drawings, in which exemplary embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

It will be understood that the term "and/or" includes any and all combinations of one or more of the associated listed items. It will also be understood that, although the terms first, second, third etc. may be used herein to describe various elements, components, regions, parts and/or sections, these elements, components, regions, parts and/or sections should not be limited by these terms. These terms are only used to distinguish one element, component, region, part or section from another element, component, region, layer or section. Thus, a first element, component, region, part or section discussed below could be termed a second element, component, region, layer or section without departing from the teachings of the present disclosure.

The following description with reference to the accompanying drawings is provided to explain the exemplary embodiments of the disclosure. Note that in the case of no conflict, the embodiments of the present disclosure and the features of the embodiments may be arbitrarily combined with each other.

As indicated in the section of the cross-reference, the instant disclosure claims priority of several Chinese patent applications, and the disclosures of which are incorporated herein in their entirety by reference. When it comes to claim construction, the claims, specification, and prosecution history of the instant disclosure controls if any inconsistency between the instant disclosure and the incorporated disclosures exists.

Figure 2:
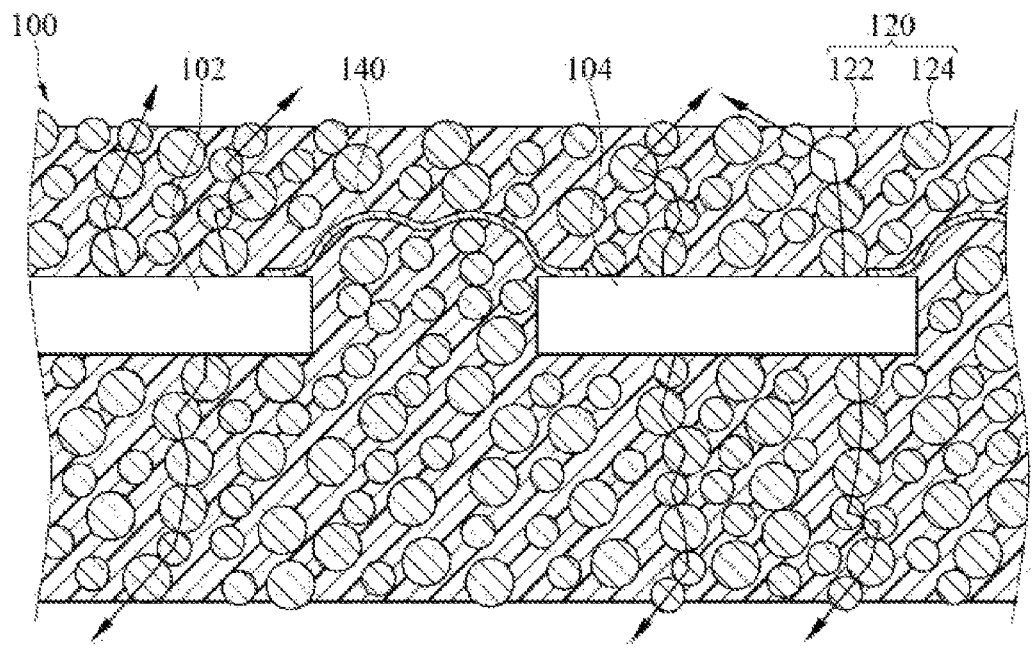
FIG. 2 illustrates a partial cross-sectional view at section 2-2 of FIG. 1.

Please refer to FIGS. 1 and 2. FIG. 1 illustrates a perspective view of an LED filament with partial sectional view according to a first embodiment of the present disclosure while FIG. 2 illustrates a partial cross-sectional view at section 2-2 of FIG. 1. According to the first embodiment, the LED filament 100 comprises a plurality of LED chips 102, 104, at least two conductive electrodes 110, 112, and a light conversion coating 120. The conductive electrodes 110, 112 are disposed corresponding to the plurality of LED chips 102, 104. The LED chips 102, 104 are electrically connected together. The conductive electrodes 112, 114 are electrically connected with the plurality of LED chips 102, 104. The light conversion coating 120 coats on at least two sides of the LED chips 102, 104 and the conductive electrodes 110, 112. The light conversion coating 120 exposes a portion of two of the conductive electrodes 110, 112. The light conversion coating 120 comprises an adhesive 122 and a plurality of phosphors 124.

LED filament 100 emits light while the conductive electrodes 110, 112 are applied with electrical power (electrical current sources or electrical voltage sources). In this embodiment, the light emitted from the LED filament 100 is substantially close to 360 degrees light like that from a point light source. An LED light bulb 10a, 10b, illustrated is in FIGS. 12A and 12B, utilizing the LED filament 100 is capable of emitting omnidirectional light, which will be described in detailed in the followings.

As illustrated in the FIG. 1, the cross-sectional outline of the LED filament 100 is rectangular. However, the cross-sectional outline of the LED filament 100 is not limited to rectangular, but may be triangle, circle, ellipse, square, diamond, or square with chamfers.

Each of LED chips 102, 104 may comprise a single LED die or a plurality of LED dies. The outline of the LED chip 102, 104 may be, but not limited to, a strip shape which does not have the problem of current diffusion uniform distribution. Therefore, extended electrodes are not required on the electrodes of the LED chip 102, 104 to help the current diffusion. The extended electrodes may shield the illumination of the LED chip, thereby affecting the illumination efficiency. In addition, the LED chips 102, 104 may be coated on their surfaces with a conductive and transparent layer of Indium Tim Oxide (ITO). The metal oxide layer contributes to uniform distribution of the current diffusion and to increase of illumination efficiency. Specifically, the aspect ratio of the LED chip may be 2:1 to 10:1; for example, but not limited to, 14×28 or 10×20. Further, the LED chips 102, 104 may be high power LED dies and are operated at low electrical current to provide sufficient illumination but less heat.

The LED chips 102, 104 may comprise sapphire substrate or transparent substrate. Consequently, the substrates of the LED chips 102, 104 do not shield/block light emitted from the LED chips 102, 104. In other words, the LED chips 102, 104 are capable of emitting light from each side of the LED chips 102, 104.

The electrical connections among the plurality of LED chips 102, 104 and the conductive electrodes 112, 114, in this embodiment, may be shown in FIG. 1. The LED chips 102, 104 are connected in series and the conductive electrodes 112, 114 are disposed on and electrically and respectively connected with the two ends of the series-connected LED chips 102, 104. However, the connections between the LED chips 102, 104 are not limited to that in FIG. 1. Alternatively, the connections may be that two adjacent LED chips 102, 104 are connected in parallel and then the parallel-connected pairs are connected in series.

Figure 3A:
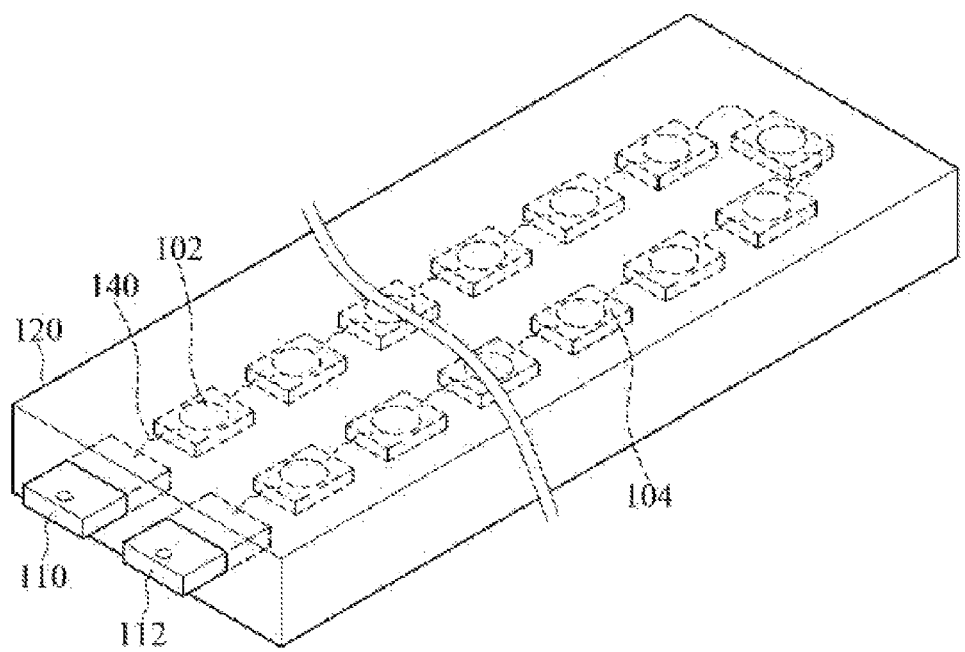
FIGS. 3A and 3B illustrate disposition of the metal electrodes and the plurality of LED chips according to other embodiments of the LED filament.
Figure 3B:
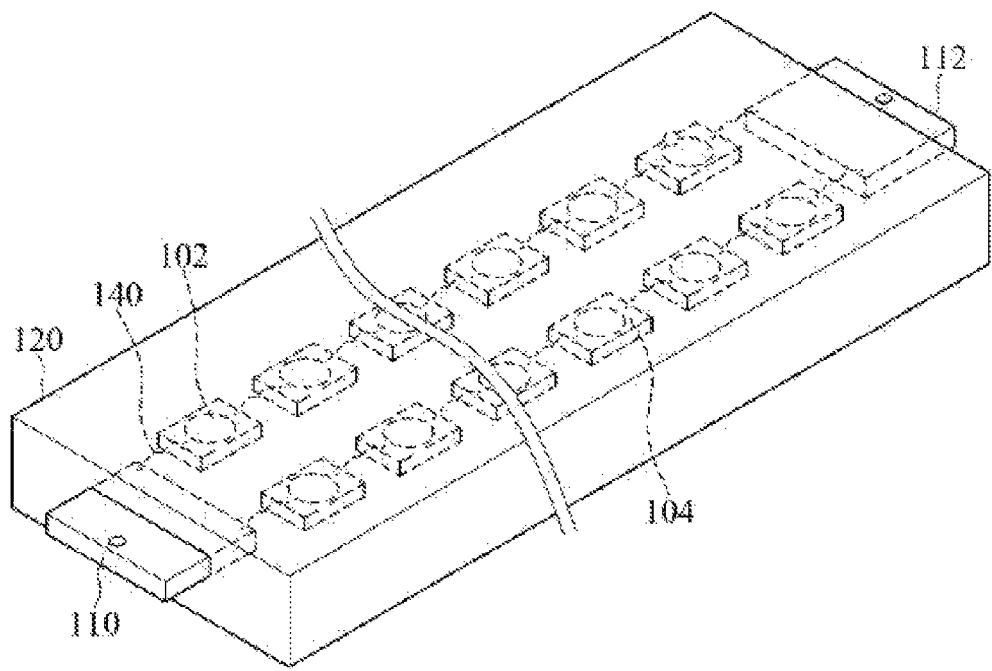

According to this embodiment, the conductive electrodes 110, 112 may be, but not limited to, metal electrodes. The conductive electrodes 110, 112 are disposed at two ends of the series-connected LED chips 102, 104 and a portion of each of the conductive electrodes 110, 112 are exposed out of the light conversion coating 120. In an embodiment of at least three conductive electrodes 110, 112, a portion of two of the conductive electrodes 110, 112 are exposed out of the light conversion coating 120. Please refer to FIGS. 3A and 3B which illustrate disposition of metal electrodes and a plurality of LED chips according to other embodiments of the LED filament. In the embodiment of FIG. 3A, the LED chips 102, 104 are connected in series and the two ends of the series-connected LED chips 102, 104 are positioned at the same side of the LED filament 100 to form an U shape. Accordingly, the two conductive electrodes 110, 112 are positioned at the same side as the ends of the series-connected LED chips 102, 104. According to the embodiment of FIG. 3B, the LED chips 102, 104 are disposed along two parallel LED strips and the LED chips 102, 104 along the same LED strip are connected in series. Two conductive electrodes 110, 112 are disposed at two ends of the series-connected LED chips 102, 104 and electrically connected to each of ends of the series-connected LED chips 102, 104. In this embodiment of FIG. 3B, there are, but not limited to, only two conductive electrodes 110, 112. For examples, the LED filament 100, in practices, may comprise four sub-electrodes. The four sub-electrodes are connected to four ends of the series-connected LED chips 102, 104, respectively. The sub-electrodes may be connected to anode and ground as desired. Alternatively, one of two conductive electrodes 110, 112 may be replaced with two sub-electrodes, depending upon the design needs.

Figure 12A:
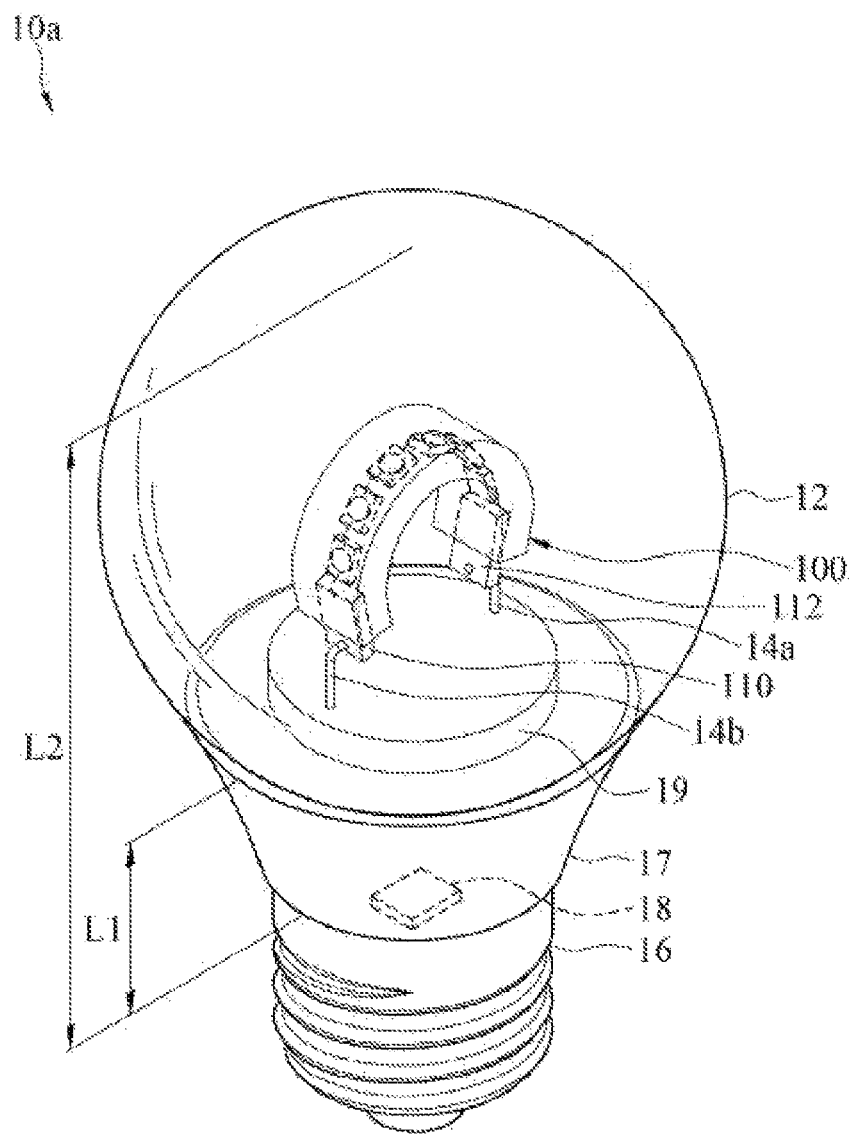
FIGS. 12A and 12B illustrate a perspective view of an LED light bulb according to a first and a second embodiments of the present disclosure.

Please further refer to FIG. 12A. The conductive electrodes 110, 112 has through holes 111, 113 (shown in FIG. 1) on the exposed portion for being connected with the conductive supports 14a, 14b of the LED light bulb 10a.

Please refer to FIGS. 1 and 2 again. According to this embodiment, the LED filament 100 further comprises conductive wires 140 for electrically connecting the adjacent LED chips 102, 104 and conductive electrodes 110, 112. The conductive wires 140 may be gold wires formed by a wire bond of the LED package process, like Q-type. According to FIG. 2, the conductive wires 140 are of M shape. The M shape here is not to describe that the shape of the conductive wires 140 exactly looks like letter M, but to describe a shape which prevents the wires from being tight and provides buffers when the conductive wires 140 or the LED filament 100 is stretched or bended. Specifically, the M shape may be any shape formed by a conductive wire 140 whose length is longer than the length of a wire which naturally arched between two adjacent LED chips 102, 104. The M shape includes any shape which could provide buffers while the conductive wires 104 are bended or stretched.

The light conversion coating 120 comprises adhesive 122 and phosphors 122. The light conversion coating 120 may, in this embodiment, wrap or encapsulate the LED chips 102, 104 and the conductive electrodes 110, 112. In other words, in this embodiment, each of six sides of the LED chips 102, 104 is coated with the light conversion coating 120; preferably, but not limited to, is in direct contact with the light conversion coating 120. However, at least two sides of the LED chips 102, 104 may be coated with the light conversion coating 120. Preferably, the light conversion coating 120 may directly contact at least two sides of the LED chips 102, 104. The two directly-contacted sides may be the major surfaces which the LED chips emit light. Referring to FIG. 1, the major two surfaces may be the top and the bottom surfaces. In other words, the light conversion coating 120 may directly contact the top and the bottom surfaces of the LED chips 102, 104 (upper and lower surfaces of the LED chips 102, 104 shown in FIG. 2). Said contact between each of six sides of the LED chips 102, 104 and the light conversion coating 120 may be that the light conversion coating 120 directly or indirectly contacts at least a portion of each side of the LED chips 102, 104. Specifically, one or two sides of the LED chips 102, 104 may be in contact with the light conversion coating 120 through die bond glue. In some embodiments, the die bond glue may be mixed with phosphors to increase efficiency of light conversion. The die bond glue may be silica gel mixed with silver powder or heat dissipating powder to increase effect of heat dissipation thereof. The adhesive 122 may be silica gel. In addition, the silica gel may be partially or totally replaced with polyimide or resin materials to improve the toughness of the light conversion coating 120 and to reduce possibility of cracking or embrittlement.

The phosphors 124 of the light conversion coating 120 absorb some form of radiation to emit light. For instance, the phosphors 124 absorb light with shorter wavelength and then emit light with longer wavelength. In one embodiment, the phosphors 124 absorb blue light and then emit yellow light. The blue light which is not absorbed by the phosphors 124 mixes with the yellow light to form white light. According to the embodiment where six sides of the LED chips 102, 104 are coated with the light conversion coating 120, the phosphors 124 absorb light with shorter wavelength out of each of the sides of the LED chips 102, 104 and emit light with longer wavelength. The mixed light (longer and shorter wavelength) is emitted from the outer surface of the light conversion coating 120 which surrounds the LED chips 102, 104 to form the main body of the LED filament 100. In other words, each of sides of the LED filament 100 emits the mixed light.

The light conversion coating 120 may expose a portion of two of the conductive electrodes 110, 112. Phosphors 124 is harder than the adhesive 122. The size of the phosphors 124 may be 1 to 30 um (micrometer) or 5 to 20 um. The size of the same phosphors 124 are generally the same. In FIG. 2, the reason why the cross-sectional sizes of the phosphors 124 are different is the positions of the cross-section for the phosphors 124 are different. The adhesive 122 may be transparent, for example, epoxy resin, modified resin or silica gel, and so on.

The composition ratio of the phosphors 124 to the adhesive 122 may be 1:1 to 99:1, or 1:1 to 50:1. The composition ratio may be volume ratio or weight ratio. Please refer to FIG. 2 again. The amount of the phosphors 124 is greater than the adhesive 122 to increase the density of the phosphors 124 and to increase direct contacts among phosphors 124. The arrow lines on FIG. 2 show thermal conduction paths from LED chips 102, 104 to the outer surfaces of the LED filament 100. The thermal conduction paths are formed by the adjacent and contacted phosphors. The more direct contacts among the phosphors 124, the more thermal conduction paths forms, the greater the heat dissipating effect the LED filament 100 has, and the less the light conversion coating becomes yellow. Additionally, the light conversion rate of the phosphors 124 may reach 30% to 70% and the total luminance efficiency of the LED light bulb 10a, 10b is increased. Further, the hardness of the LED filament 100 is increased, too. Accordingly, the LED filament 100 may stand alone without any embedded supporting component like rigid substrates. Furthermore, the surfaces of cured LED filament 100 are not flat due to the protrusion of some of the phosphors 124. In other words, the roughness of the surfaces and the total surface area are increased. The increased roughness of the surfaces improves the amount of light passing the surfaces. The increased surface area enhances the heat dissipating effect. As a result, the overall luminance efficiency of the LED light filament 100 is raised.

Next, LED chips 102, 104 may comprise LED dies which emit blue light. The phosphors 124 may be yellow phosphors (for example Garnet series phosphors, YAG phosphors), so that the LED filament 100 may emit white light. In practices, the composition ratio of phosphors 124 to the adhesive 122 may be adjusted to make the spectrum of the white light emitted from the LED filament 100 closer to that emitted from incandescent bulbs. Alternatively, the phosphors 124 may be powders which absorb blue light (light with shorter wavelength) and emit yellow green light (hereinafter referred to yellow green powders) or emit red light (hereinafter referred to red powders) (light with longer wavelength). The light conversion coating 120 may comprise less red powders and more yellow green powders, so that the CCT (corrected color temperature) of the light emitted from the LED filament 100 may close to 2,400 to 2,600 K (incandescent light).

As mention above, a desired deflection of the LED filament 100 may be achieved by the adjustment of the ratio of phosphors 124 to the adhesive 122. For instance, the Young's Modulus (Y) of the LED filament 100 may be between $0.1 \times 10^{10}$ to $0.3 \times 10^{10}$ Pa. If necessary, the Young's Modulus of the LED filament 100 may be between $0.15 \times 10^{10}$ to $0.25 \times 10^{10}$ Pa. Consequently, the LED filament 100 would not be easily broken and still possess adequate rigidity and deflection.

Figure 4:
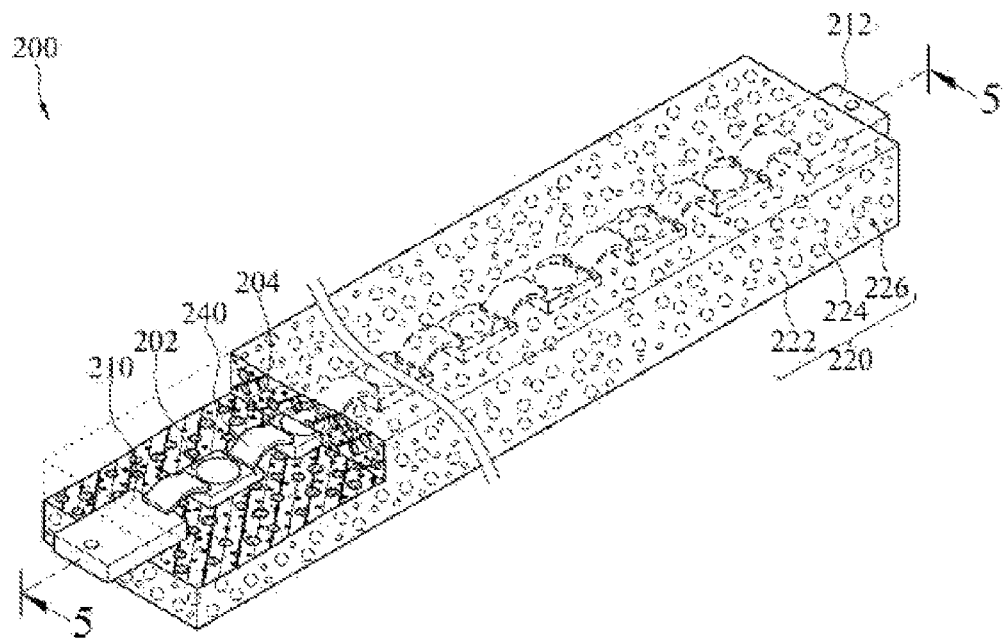
FIG. 4 illustrates a perspective view of an LED filament with partial sectional view according to a second embodiment of the present disclosure.
Figure 5:
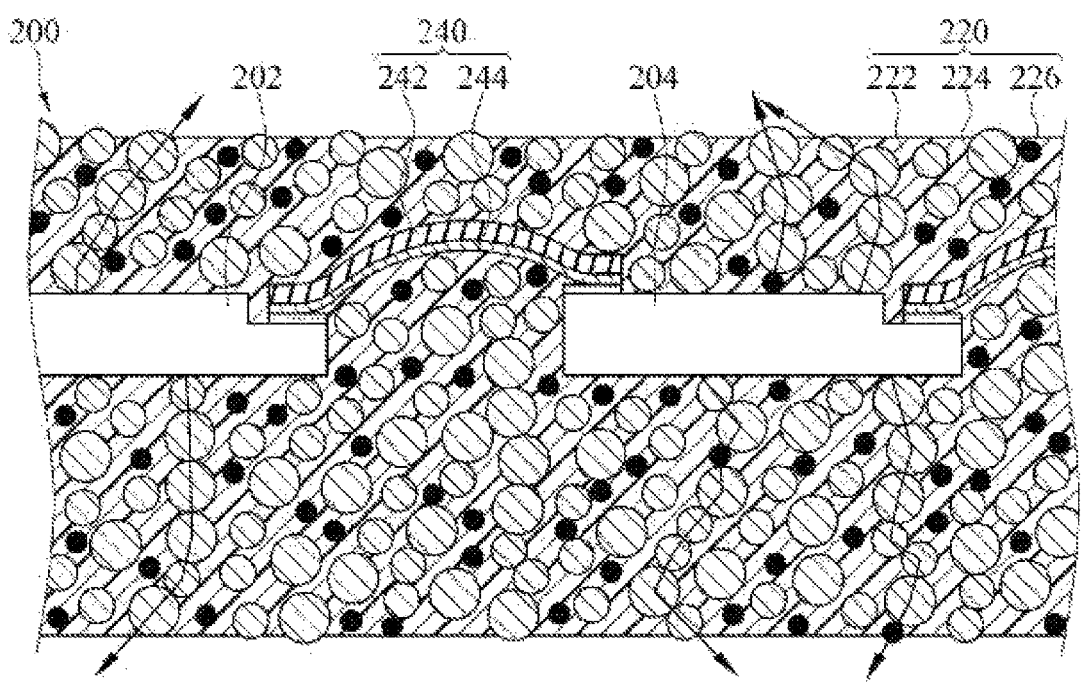
FIG. 5 illustrates a partial cross-sectional view at section 5-5 of FIG. 4.

Please refer to FIGS. 4 to 5. FIG. 4 illustrates a perspective view of an LED light bulb with partial sectional view according to a second embodiment of the LED filament and FIG. 5 illustrates a partial cross-sectional view at section 5-5 of FIG. 4.

According to the second embodiment of the LED filament 200, the LED filament 200 comprises a plurality of LED chips 202, 204, at least two conductive electrodes 210, 212, and a light conversion coating 220. The conductive electrodes 210, 212 are disposed corresponding to the plurality of LED chips 202, 204. The plurality of LED chips 202, 204 and the conductive electrodes 212, 214 are electrically connected therebetween. The light conversion coating 220 coats on at least two sides of the LED chips 202, 204 and the conductive electrodes 210, 212. The light conversion coating 220 exposes a portion of two of the conductive electrodes 210, 212. The light conversion coating 220 comprises an adhesive 222, a plurality of inorganic oxide nanoparticles 226 and a plurality of phosphors 224.

The size of the plurality of inorganic oxide nanoparticles 226 is around 10 to 300 nanometers (nm) or majorly is around 20 to 100 nm. The size of the plurality of inorganic oxide nanoparticles 226 is lesser than that of the phosphors 224. The plurality of the inorganic oxide nanoparticles 226 may be, but not limited to, aluminium oxides ($Al_2O_3$), silicon oxide ($SiO_2$), zirconium oxide (Zirconia, $ZrO_2$), titanic oxide ($TiO_2$), Calcium oxide (CaO), strontium oxide (SrO), and Barium oxide (BaO).

As shown in FIG. 5, the inorganic oxide nanoparticles 226 and the phosphors 224 are mixed with the adhesive 222. The unit prices and the hardnesses of the inorganic oxide nanoparticles 226 and the phosphors 224 are different. Therefore, a desired deflection, thermal conductivity, hardness, and cost of the LED filament 200 may be reached by adjustment of the ratio of the adhesive 222, phosphors 224 to the inorganic oxide nanoparticles 226 affects. In addition, due that the size of the inorganic oxide nanoparticles 226 is lesser than that of the phosphors 224, the inorganic oxide nanoparticles 226 may fill into the gaps among the phosphors 224. Hence, the contact area among the phosphors 224 and the inorganic oxide nanoparticles 226 is increased and thermal conduction paths are increased as shown by arrow lines on FIG. 5, too. Further, the inorganic oxide nanoparticles 226 may deflect or scatter light incident thereon. The light deflection and scattering make the light emitted from phosphors 224 mixed more uniformly and the characteristics of the LED filament 200 becomes even better. Furthermore, the impedance of the inorganic oxide nanoparticles 226 is high and no electrical leakage would happen through the inorganic oxide nanoparticles 226.

In some embodiments, the phosphors 224 are substantially uniformly distributed in the adhesive 222 (for instance, in silica gel, the polyimide or resin materials). Each of the phosphors 224 may be partially or totally wrapped by the adhesive 222 to improve the cracking or embrittlement of the light conversion coating 220. In the case that not each of the phosphors 224 is totally wrapped by the adhesive 222, the cracking or embrittlement of the light conversion coating 220 is still improved. In some embodiments, silica gel may be mixed with the polyimide or resin materials to form the light conversion coating 220.

The LED filament 200 further comprises a plurality of circuit film 240 (or call as transparent circuit film) for electrically and correspondingly connected among the plurality of LED chips and the conductive electrodes. Specifically, the plurality of circuit film 240 is electrically connecting the adjacent LED chips 202, 204 and conductive electrodes 210, 212. The light conversion coating 220 may encapsulate the plurality of circuit film 240.

Figure 6A:
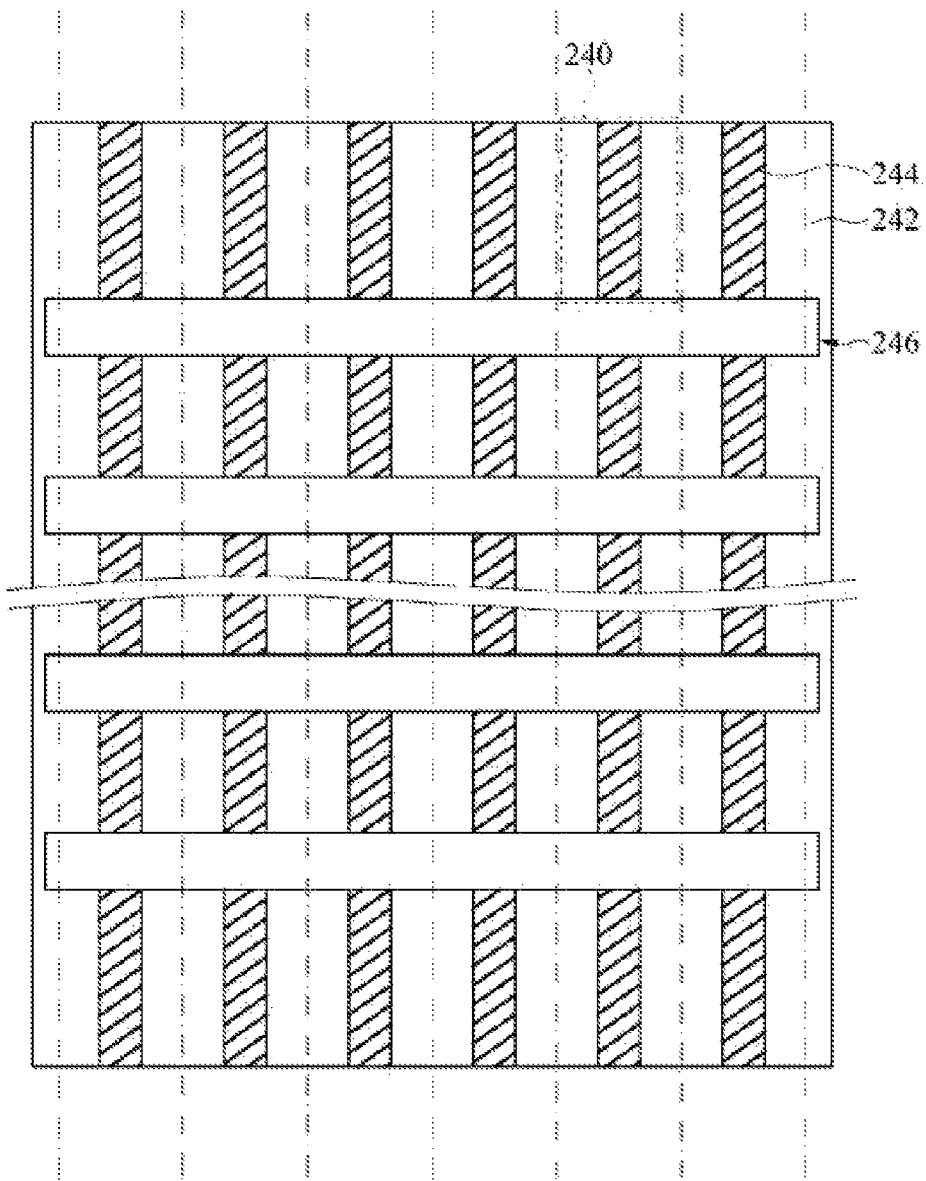
FIG. 6A illustrates a first embodiment of the uncut circuit film according to the second embodiment of the LED filament.

Please refer to FIG. 6A. FIG. 6A illustrates a first embodiment of the uncut circuit film according to the second embodiment of the LED filament 200. Each of the circuit films 240 comprises a first film 242 and a conductive circuit 244 disposed on the first film 242. The first film 242 in one embodiment may be, but not limited to, a thin film. In order to be easily understood the embodiments, the following description uses thin film as an example for the first film 242. However, the thin film 242 is not the only embodiment for the first film 242. The thin film 242 may be a transparent or translucent film. The transparent film may allow light emitted from the LED chips 202, 204 and/or phosphors 124 to pass. The conductive circuits 244 are electrically and correspondingly connected among the plurality of LED chips 202, 204 and the conductive electrodes 210, 212. In this embodiment, the conductive circuits 244 are of bar shape and substantially parallel to each other. However, the conductive circuits 244 may be in other shape or pattern. Please refer to FIG. 7A which illustrates a second embodiment of the uncut circuit film according to the second embodiment of the LED filament. Each of the circuit films 240a comprises a thin film 242a and a conductive circuit 244a disposed on the thin film 242a. The conductive circuits 244a are substantially parallel lines electrically connected with pads of adjacent LED chips 202, 204 as shown in FIG. 7B. Please refer to FIG. 8A which illustrates a third embodiment of the uncut circuit film according to the second embodiment of the LED filament. Each of the circuit films 240b comprises a thin film 242b and a conductive circuit 244b disposed on the thin film 242b. The conductive circuits 244b are crossover lines electrically connected with pads of adjacent LED chips 202b, 204b as shown in FIG. 8B. The width of the lines may be 10 micrometers (um) and the thickness of the lines may be 2 um. The pattern or shape of the conductive circuits 244, 244a, and 244b are not limited to the above-mentioned embodiments, any pattern or shape which is capable of connecting pads of adjacent LED chips 202, 204 and conductive electrodes 210, 212 are feasible.

The thin film 242 may be, but not limited to, Polyimide film (PI film). Transmittance of the polyimide film is above 92%. The material of the conductive circuit 244 may be, but not limited to, indium tin oxide (ITO), nano-silver plasma, metal grids, or nano-tubes. The advantages of Silver include good reflection and low light absorption. Nano-scaled silver lines in grid shape have advantages of low resistance and high penetration of light. In addition, gold-dopped nano-silver lines may enhance the adherence between the pads of the LED chips 202, 204 and the sliver lines (conductive circuits).

Please refer to FIG. 6A again. The circuit film 240 may be made by firstly forming conductive circuits 244 on a thin film 242, and then forming slots 246 on the thin film 242 with the conductive circuits 244.

Please refer to FIG. 6A. The conductive circuits 244 do not cover the whole surface of the thin film 242. Consequently, light emitted from the LED chips 202, 204 can pass through the circuit film 240 at least from the portion of the thin film 242 where the conductive circuits 244 do not occupy. In the second embodiment, the circuit film 240 is used to electrically connect with adjacent LED chips 202, 204 and the conductive electrodes 210, 212. The circuit film 240 has the advantages of wider conductive lines, better deflection, and better toughness (less possibility of being broken) than the conductive wires 140 in the first embodiments.

Regarding the electrical connection among the circuit film 240, LED chips 202, 204, and the conductive electrodes 210, 212, conductive glues may be applied on the surfaces of the LED chips 202, 204 and the conductive electrodes 210, 212 where the conductive circuits 244 are going to electrically connect. The conductive glues may be, but not limited to, silver paste, solder paste (tin paste), or conductive glues doped with conductive particles. Then, dispose the circuit film 240 on the LED chips 202, 204 and the conductive electrodes 210, 212 with adequate alignment and cure the circuit film 240 and the conductive glues by heat or UV.

Figure 9A:
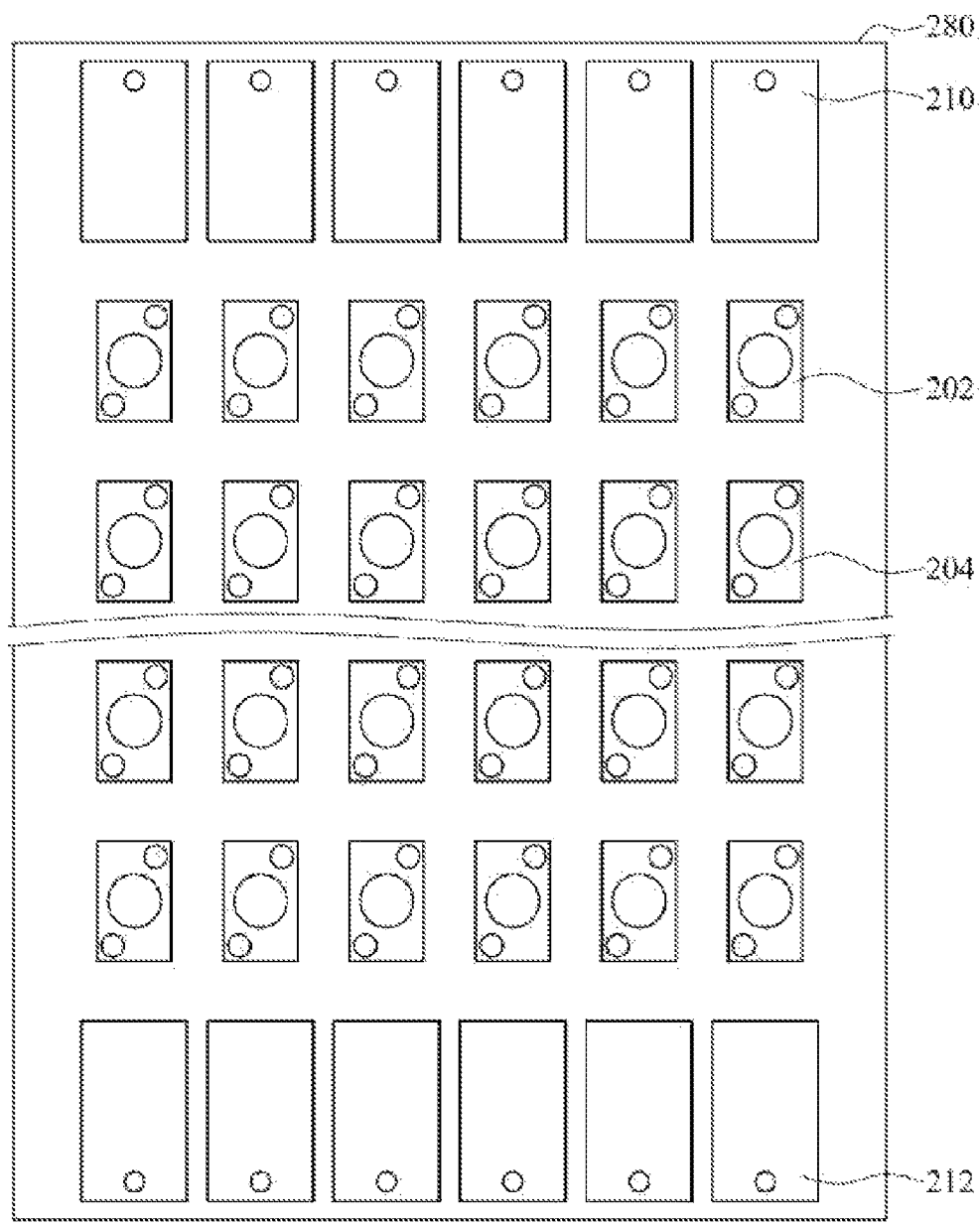
FIGS. 9A to 9E illustrate a manufacturing method of an LED filament according to a first embodiment of the present disclosure.
Figure 9B:
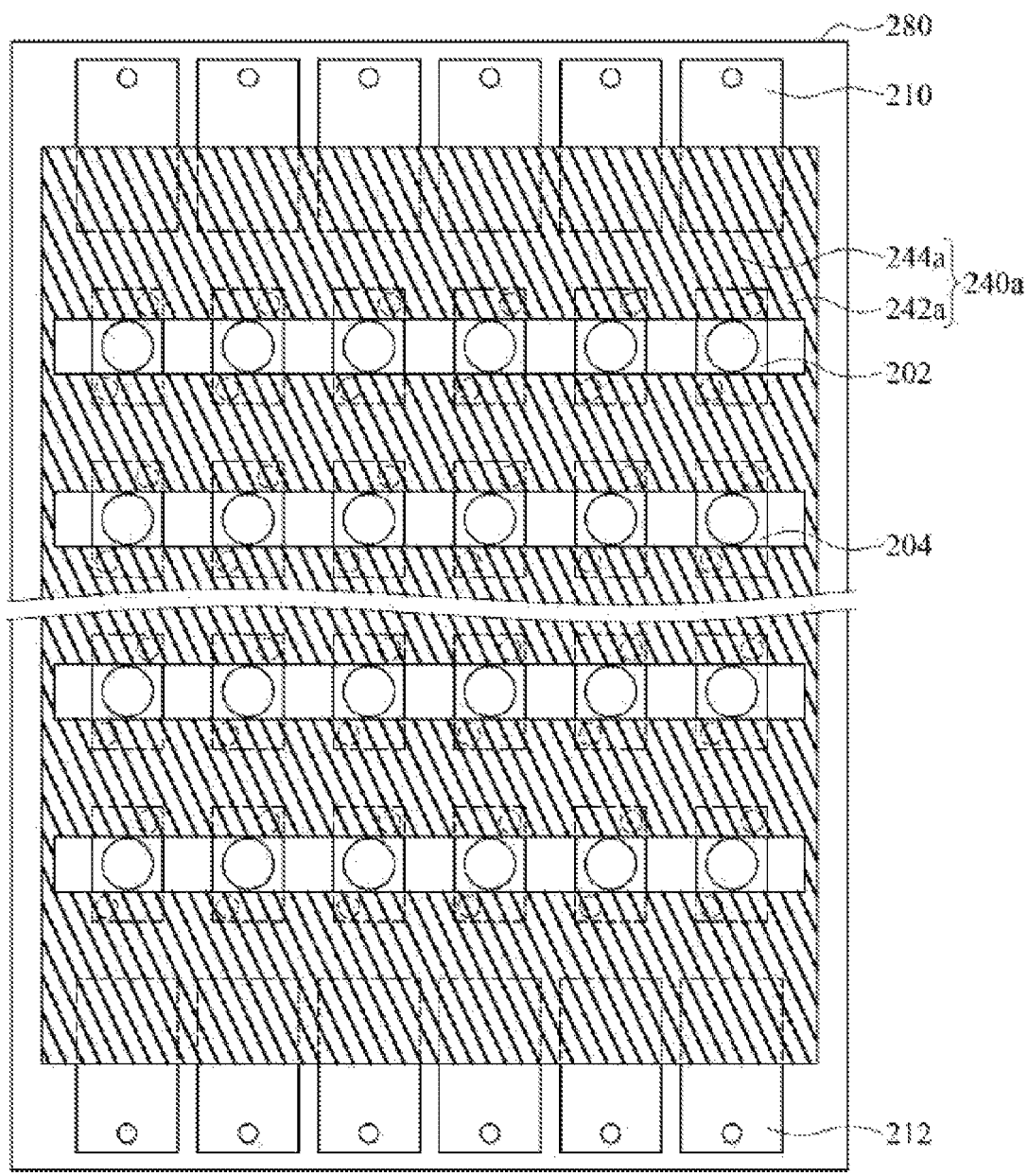

Please refer to FIGS. 9A to 9E which illustrate a manufacturing method of an LED filament according to a first embodiment. The manufacturing method of the LED filament 200 comprises:

S20: dispose LED chips 202, 204 and at least two conductive electrodes 210, 210 on a carrier 280, referring to FIG. 9A;

S22: electrically connect the LED chips 202, 204 with the conductive electrodes 210, 212, referring to FIG. 9B; and S24: dispose a light conversion coating 220 on the LED chips 202, 204 and the conductive electrodes 210, 212. The light conversion coating 220 coats on at least two sides of the LED chips 202, 204 and the conductive electrodes 210, 212. The light conversion coating 220 exposes a portion of at least two of the conductive electrodes 210, 212. The light conversion coating 220 comprises adhesive 222 and a plurality of phosphors 224, referring to FIGS. 9C to 9E.

In S20, the plurality of LED chips 202, 204 are disposed in a rectangular array. Each column of the LED chips 202, 204, at the end of the manufacturing process, may be cut into a single LED filament 200. During disposition of the LED chips 202, 204, the anodes and cathodes of the LED chips 202, 204 should be properly orientated for later connected in series or parallel. The carrier 280 may be, but not limited to, glass substrate or metal substrate. The carrier 280 may be, but not limited to, a plate like that shown in FIG. 9A, or a plate with a groove like the carrier 180 shown in FIG. 10. The groove is for being disposed with the base layer 120b.

Figure 7A:
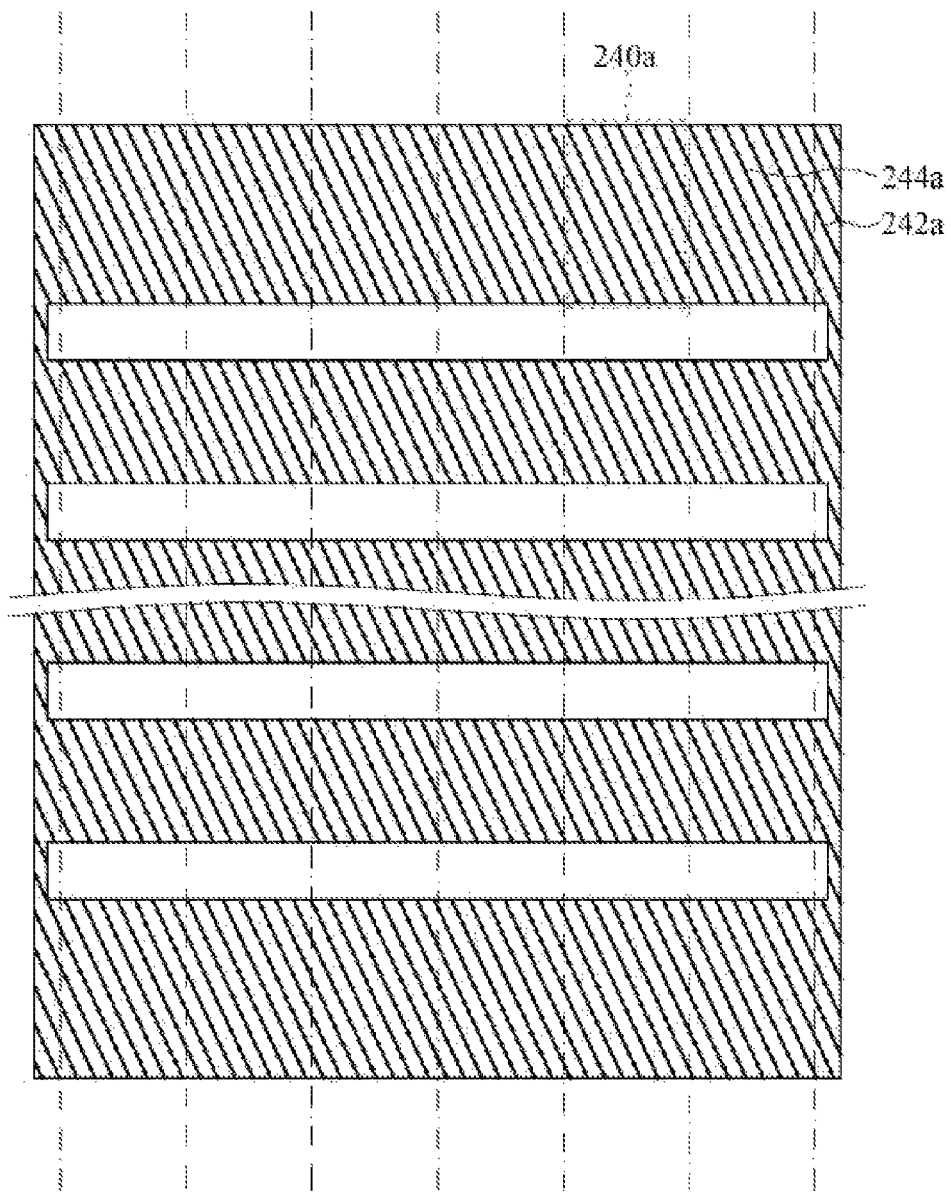
FIG. 7A illustrates a second embodiment of the uncut circuit film according to the second embodiment of the LED filament.
Figure 7B:
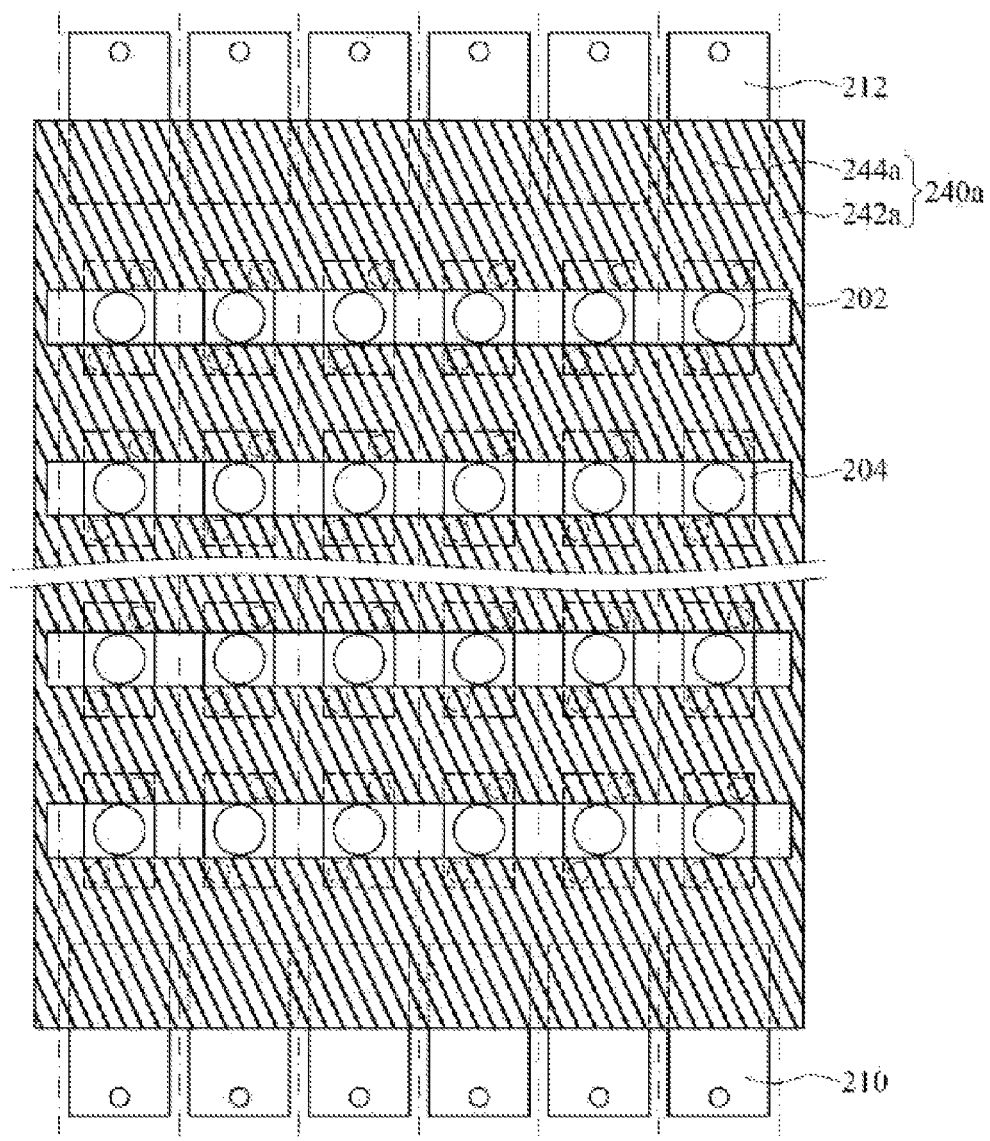
FIG. 7B illustrates the alignment between the LED chips and the second embodiment of the uncut circuit film of FIG. 7A.

In S22, the uncut circuit film 240a is similar to the circuit film 240a shown in FIG. 7A. The LED chips 202, 204 and the conductive circuit 210, 212 are electrically connected by the parallel conductive lines. Alternatively, the circuit film 240, 240b shown, respectively, in FIG. 6A or 8A may be used in S22. The conductive wires 140 shown in FIG. 2 can be used in S22, too.

In S24, the light conversion coating 220 may be coated on the LED chips 202, 204 and the conductive electrodes 210, 212 by different method. Firstly, taking FIGS. 9C to 9E as an example, the manufacturing method of S24 comprises:

S240: coat a light conversion sub-layer (top layer 220a) on a surface of the LED chips 202, 204 and the conductive electrodes 210, 212 which is not contact with the carrier 280;

S242: flip over the LED chips 202, 204 and the conductive electrodes 210, 212 disposed with the top layer 220a; and S244: coat a light conversion sub-layer (base layer 220b) on a surface of the LED chips 202, 204 and the conductive electrodes 210, 212 which are not coated with the top layer 220a.

In order to distinguish the light conversion sub-layers in S240 and in S244, the light conversion sub-layer in S240 is referred to top layer 220a and the light conversion sub-layer in S244 is referred to base layer 220b hereinafter.

In S240, after the LED chips 202, 204 and the conductive electrodes 210, 212 are coated with the top layer 220a, the adhesive 222 and the phosphors 224 will fill out the gaps among the LED chips 202, 204 and the conductive electrodes 210, 212. Then, proceed with a curing process to harden the top layer which encapsulates the upper part of the LED chips 202, 204 and the conductive electrodes 210, 212 and exposes a portion of at least two of the conductive electrodes 210, 212. The curing process may be done by heat or UV.

In S242, the flip-over of the semi-finished piece may be done by two different ways in accordance with different situations. Concerning the first flip-over way, the LED chips 202, 204 and the conductive electrodes 210, 212 are disposed on the carrier 280 without any adherences with the carrier 280. S242 can be done by flip the cured semi-finished piece over directly. Then, place the flipped-over semi-finished piece on the carrier 280 again. (The semi-finished piece is the cured the LED chips 202, 204 and the conductive electrodes 210, 212 covered with the top layer 220a.)

As for the second way, glues are applied on the carrier 280. The glues are, for instance, photoresist in semiconductor process, or die bond glues. The glues (photoresist or die bond glues) is for temporarily fixing the LED chips 202, 204 and the conductive electrodes 210, 212 on the carrier 280. The glue may be removed by acetone or solvent and the semi-finished piece is separated from the carrier 280. If necessary, the remained glues may be removed by an additional cleaning process.

Figure 9C:
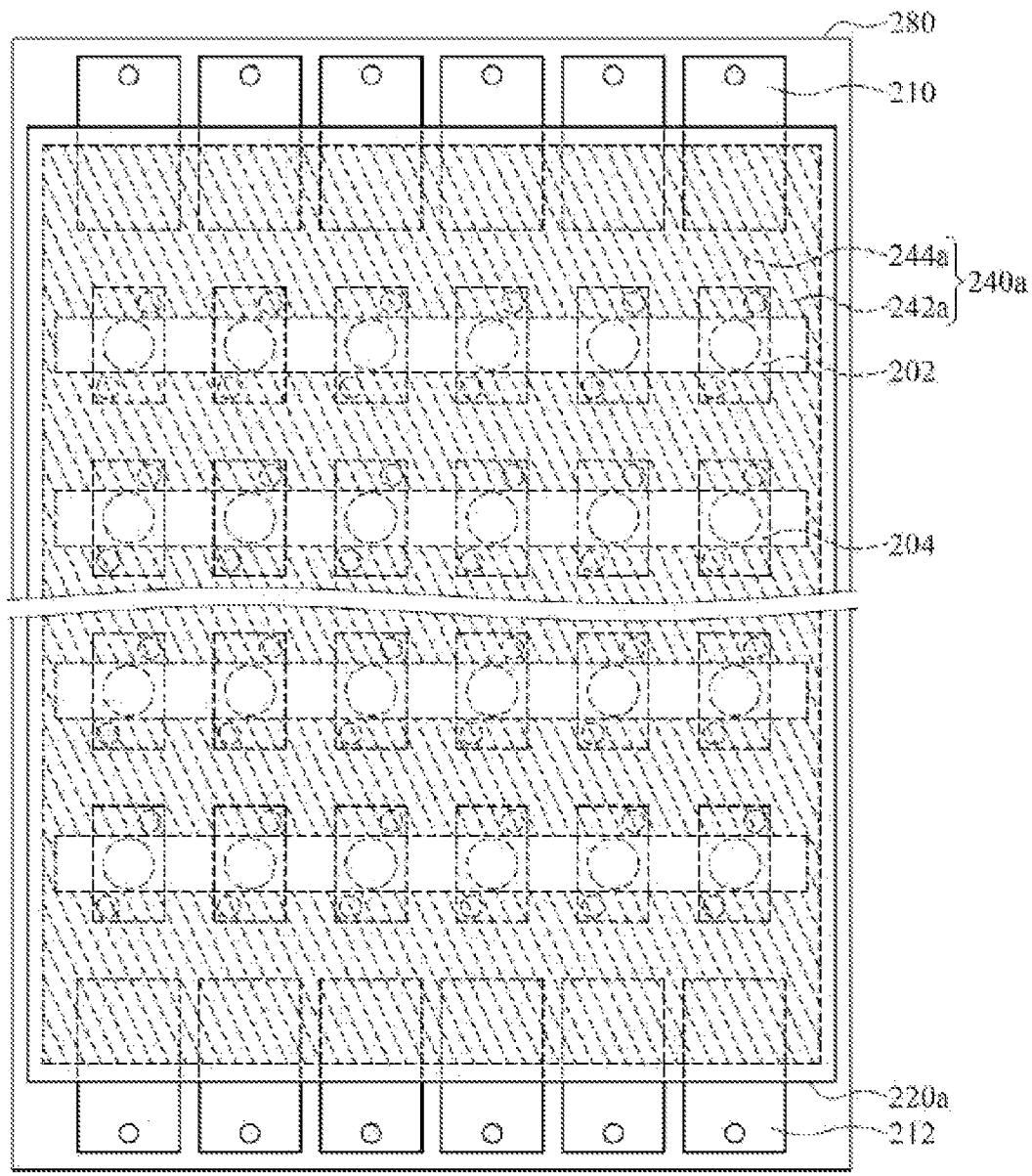
Figure 9D:
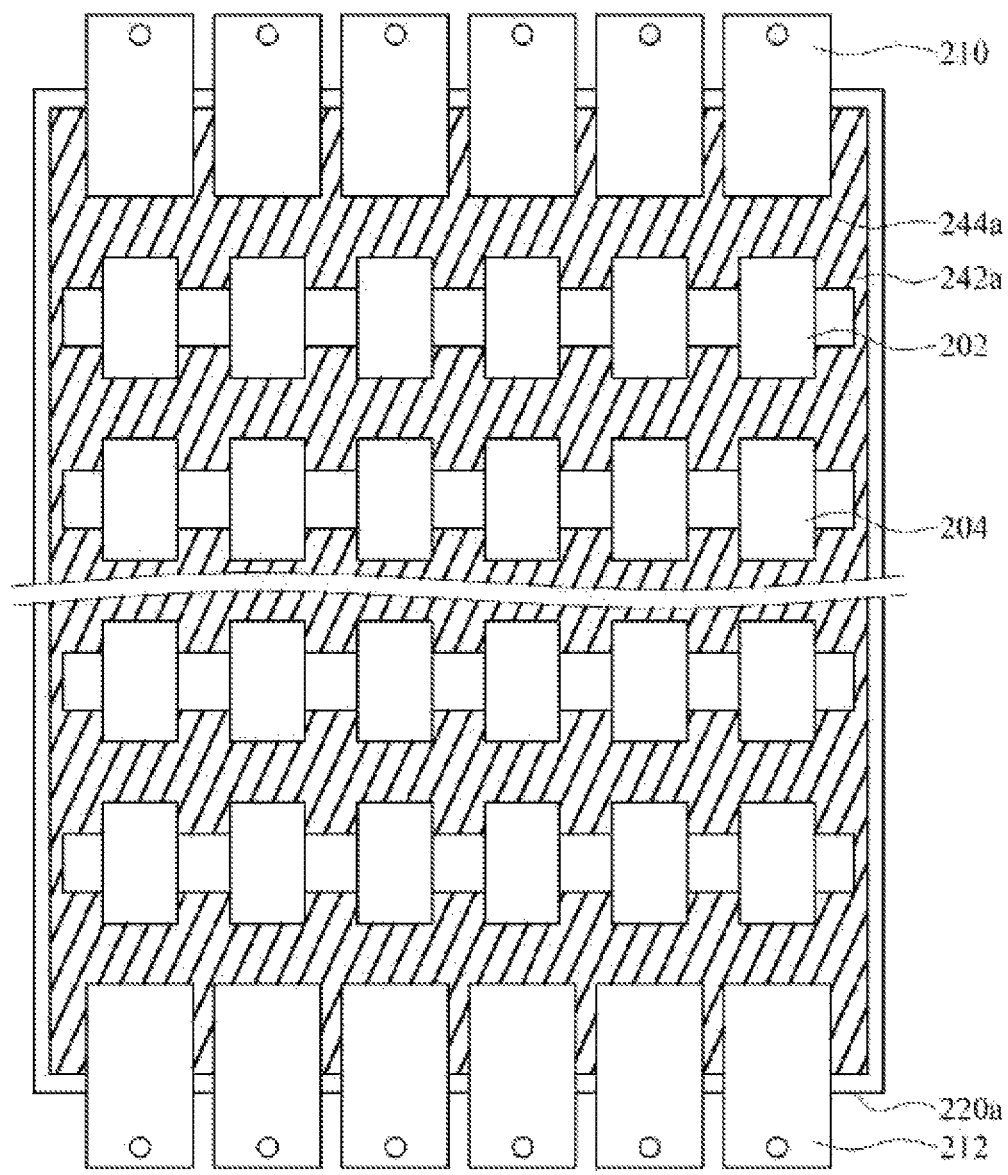
Figure 9E:
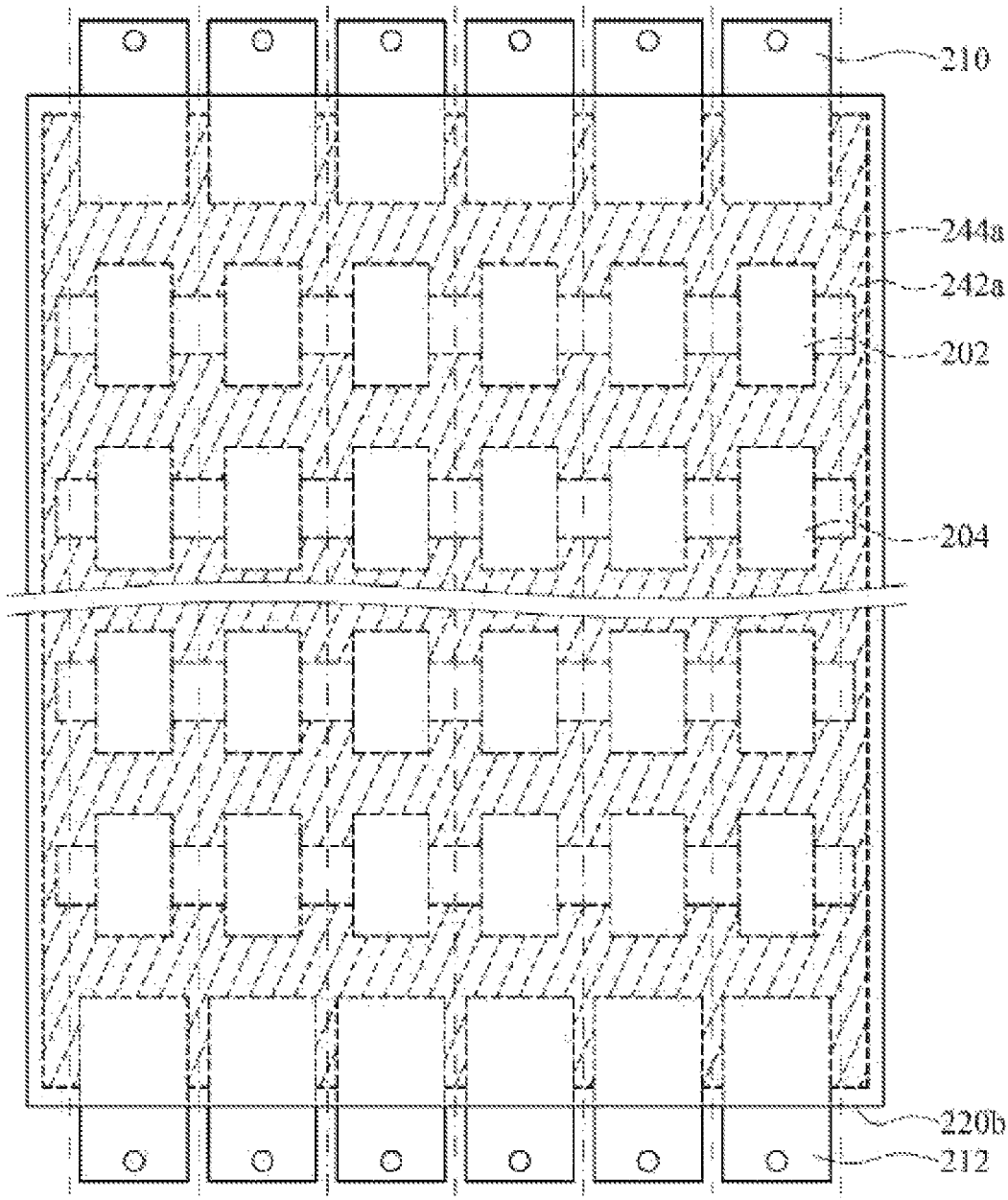

In S244, referring to FIG. 9E, cure the base layer 220b after the base layer 220b is coated on the surface of the LED chips 202, 204 and the conductive electrodes 210, 212.

Referring to FIG. 9C, the top layer 220a is slightly greater than the uncut circuit film 240a. However, it is not a requirement. The sizes of the top layer 220a may be the same as or lesser than that of the uncut circuit film 240a. Referring to FIG. 9E, the area of the top layer 220a is substantially the same as that of the base layer 220b. It is not a requirement, either. In implementation, the area of the top layer 220a may be greater or lesser than the area of the base layer 220b. FIG. 9E illustrates a semi-finished LED filament where a plurality of LED filaments 200 are integrated into one piece.

After S24, the method may further comprise S26: cut the semi-finished LED filament along the dot-and-dash lines shown in FIG. 9E. Each cut portion is an LED filament 200. The semi-finished LED may be cut every other two dot-and-dash lines.

Figure 6B:
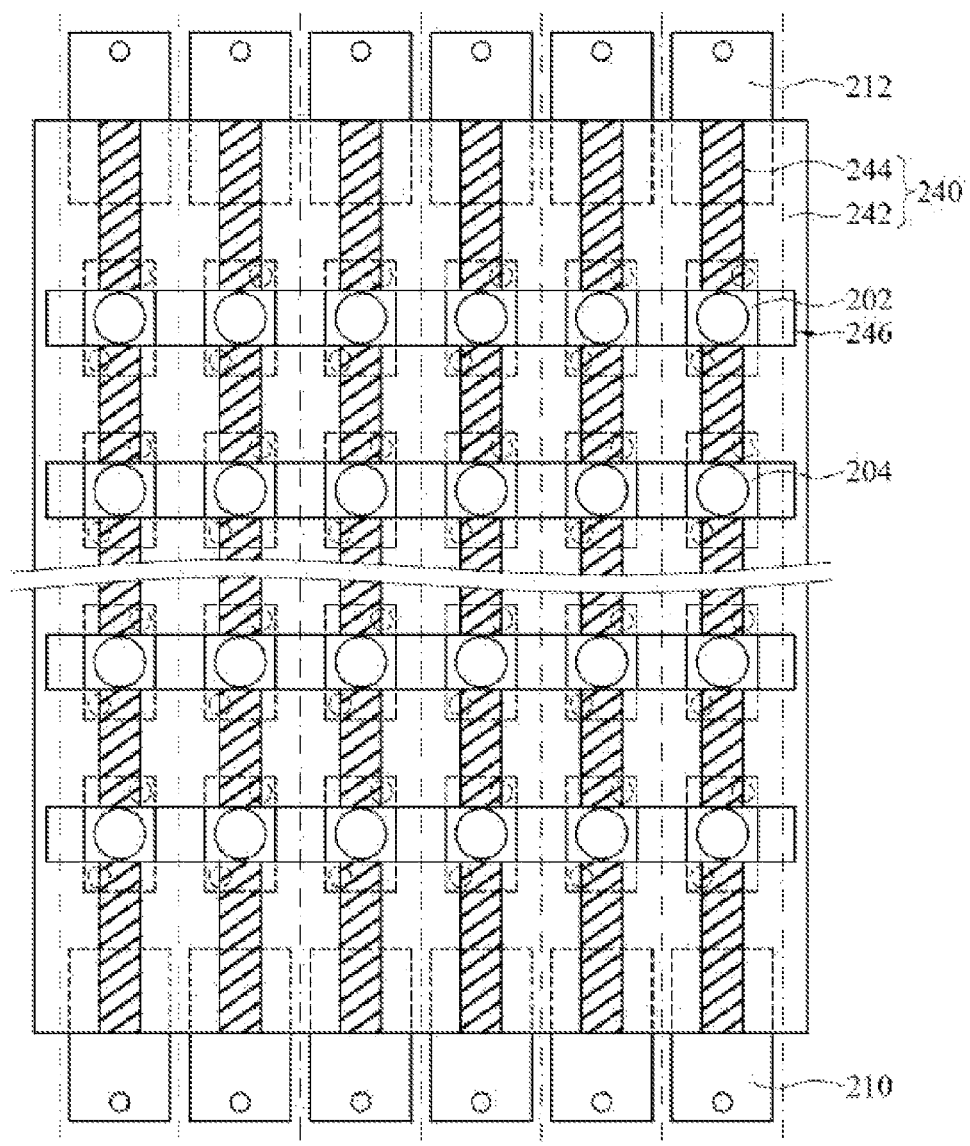
FIG. 6B illustrates the alignment between the LED chips and the first embodiment of the uncut circuit film of FIG. 6A.
Figure 8A:
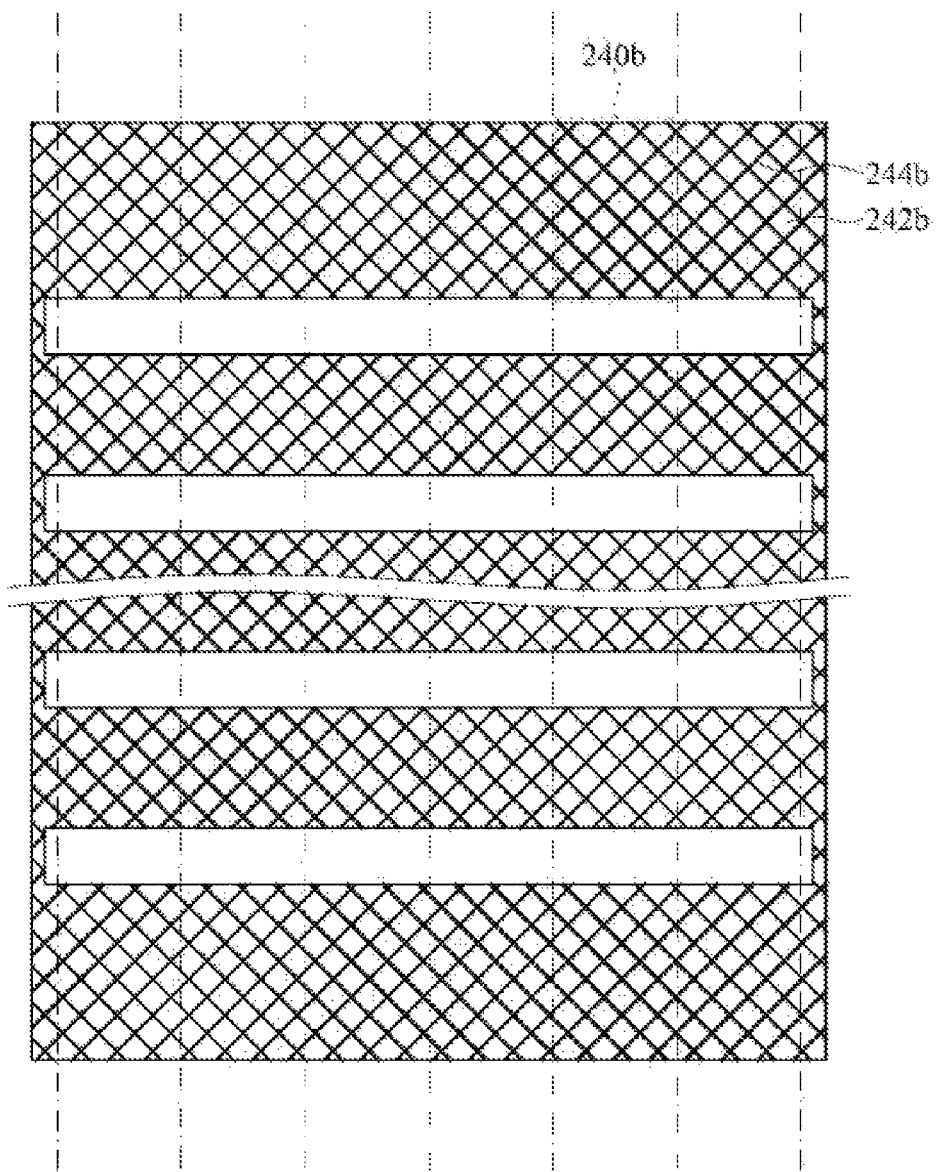
FIG. 8A illustrates a third embodiment of the uncut circuit film according to the second embodiment of the LED filament.
Figure 8B:
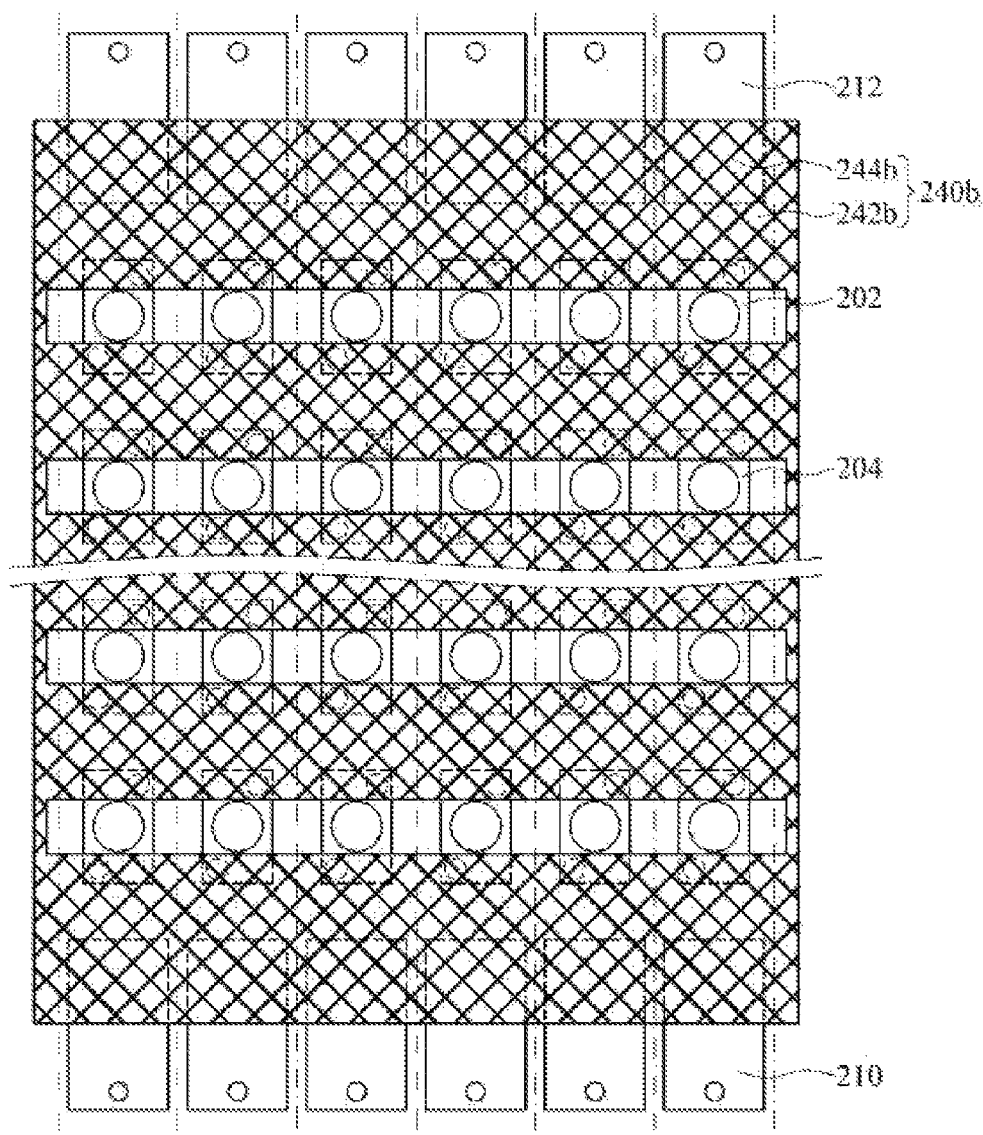
FIG. 8B illustrates the alignment between the LED chips and the third embodiment of the uncut circuit film of FIG. 8A.

FIGS. 6B, 7B and 8B illustrate uncut circuit films 240, 240a, 240b of FIGS. 6A, 7A and 8A covering the LED chips 202, 204 and the conductive electrodes 210, 212 with proper alignment.

The method of FIGS. 9A to 9E illustrates each LED filament are disposed in a rectangular array manner. Alternatively, the disposition of S20 may be a single column of LED chips 202, 204. In the consequence, S26 may be omitted.

Figure 10:
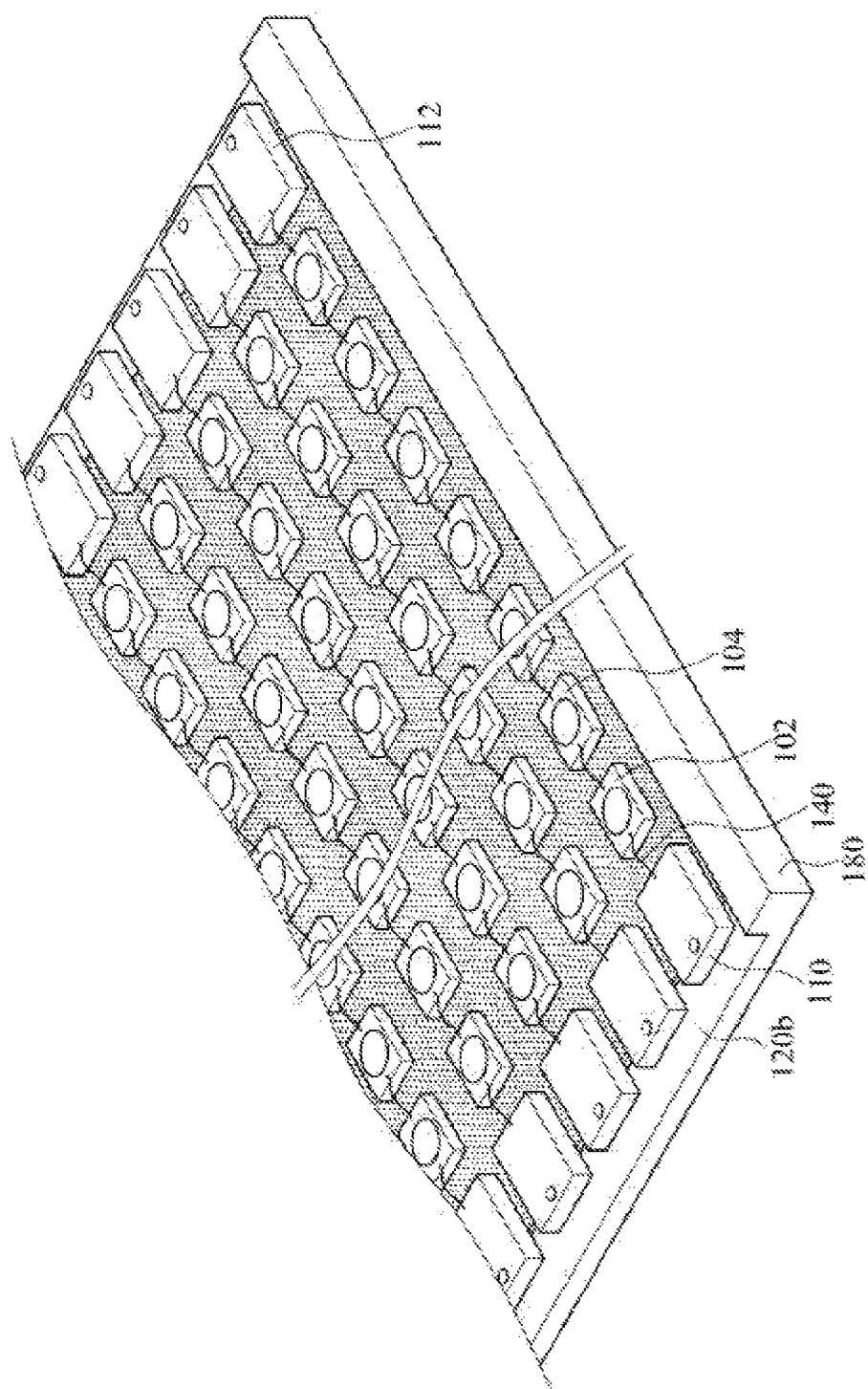
FIG. 10 illustrates a manufacturing method of an LED filament according to a second embodiment of the present disclosure.

Please refer to FIG. 10 for the second embodiment of the manufacturing method for the LED filament 200. The method comprises:

S20A: coat a light conversion sub-layer (a base layer 120b) on a carrier 180;

S20B: dispose LED chips 102, 104 and conductive electrodes 110, 112 on the base layer 120b;

S22: electrically connect the LED chips 102, 104 with the conductive electrodes 110, 112; and S24: coat a light conversion sub-layer (top layer 120a) on the LED chips 102, 104 and the conductive electrodes 110, 112. The top layer 120a coats on the LED chips 102, 104 and the conductive electrodes 110, 112. The top layer 120a and the base layer 120b expose a portion of at least two of the conductive electrodes 110, 112. The light conversion coating 120 (top layer 120a and the base layer 120b) comprises adhesive 122 and a plurality of phosphors 124.

As shown in FIG. 10, the base layer 120b is a part of the light conversion coating 120 and comprises an adhesive 122 and phosphors 124. In the embodiment of FIG. 10, the base layer 120*b* is, but not limited to, coated on the carrier 180 with a groove. Alternatively, the carrier 180 can be omitted. In other words, the base layer 120*b* may be place on a work table without any carrier 180. The LED chips 102, 104 and the conductive electrodes 110, 112 are disposed on the base layer 120*b*.

The thickness of the base layer 120*b* may be 50 to 100 um. The composition ratio of phosphors 124 to the adhesive 122 can be adjusted and the thickness of the base layer 120*b* may be around 60 to 80 um. After S20, a pre-curing process may be used to slightly cure the base layer 120*b* so that the LED chips 102, 104 and the conductive electrodes 110, 112 can be fixed on the base layer 120*b*. Besides, the LED chips 102, 104 and the conductive electrodes 110, 112 may be fixed on the base layer 120*b* by die bond glues.

After the electrical connection of S22, the top layer 120*a* is coated on the LED chips 102, 104 and the conductive electrodes 110, 112 and then a curing process is proceeded with to cure the top layer 120*a*. Consequently, the flip-over of S242 and glue-removing process are omitted.

According to the embodiment of FIG. 10, after S24, the process of S26 may be proceeded with.

The base layer 120*b* is used for carrying the LED chips 102, 104 and the conductive electrodes 110, 112 and its thickness may be 0.5 to 3 millimeter (mm) or 1 to 2 mm.

The composition ratio of phosphors 124 to the adhesive 122 may be adjusted accordingly to make the base layer 120*b* hard enough to sufficiently carry the LED chips 102, 104 and the conductive electrodes 110, 112 and for the following process like wire bond. The Shore D Hardness of the base layer 120*b* may be at least 60 HD. Hence, the overall LED filament 10*a* will have enough hardness, rigidity and deflection. The electrical conductivity of the connection among the LED chips 102, 104 and the conductive electrodes 110, 112 can be maintained even though the LED filament 10*a* is bent.

In accordance with the embodiment of FIG. 10, the hardness of the cured base layer 120*b* is better to be sufficient to carry the LED chips 102, 104 and the conductive electrodes 110, 112 and to support for the wire bonding process. However, the top layer 120*a* is not required to have the same hardness as the base layer 120*b*. Accordingly, the adjustment of ratio of the phosphors 124 to the adhesive 122 is more flexible. Alternatively, the light conversion coating 120 may comprise inorganic oxide nanoparticles 224 (not shown in FIG. 10).

Figure 11A:
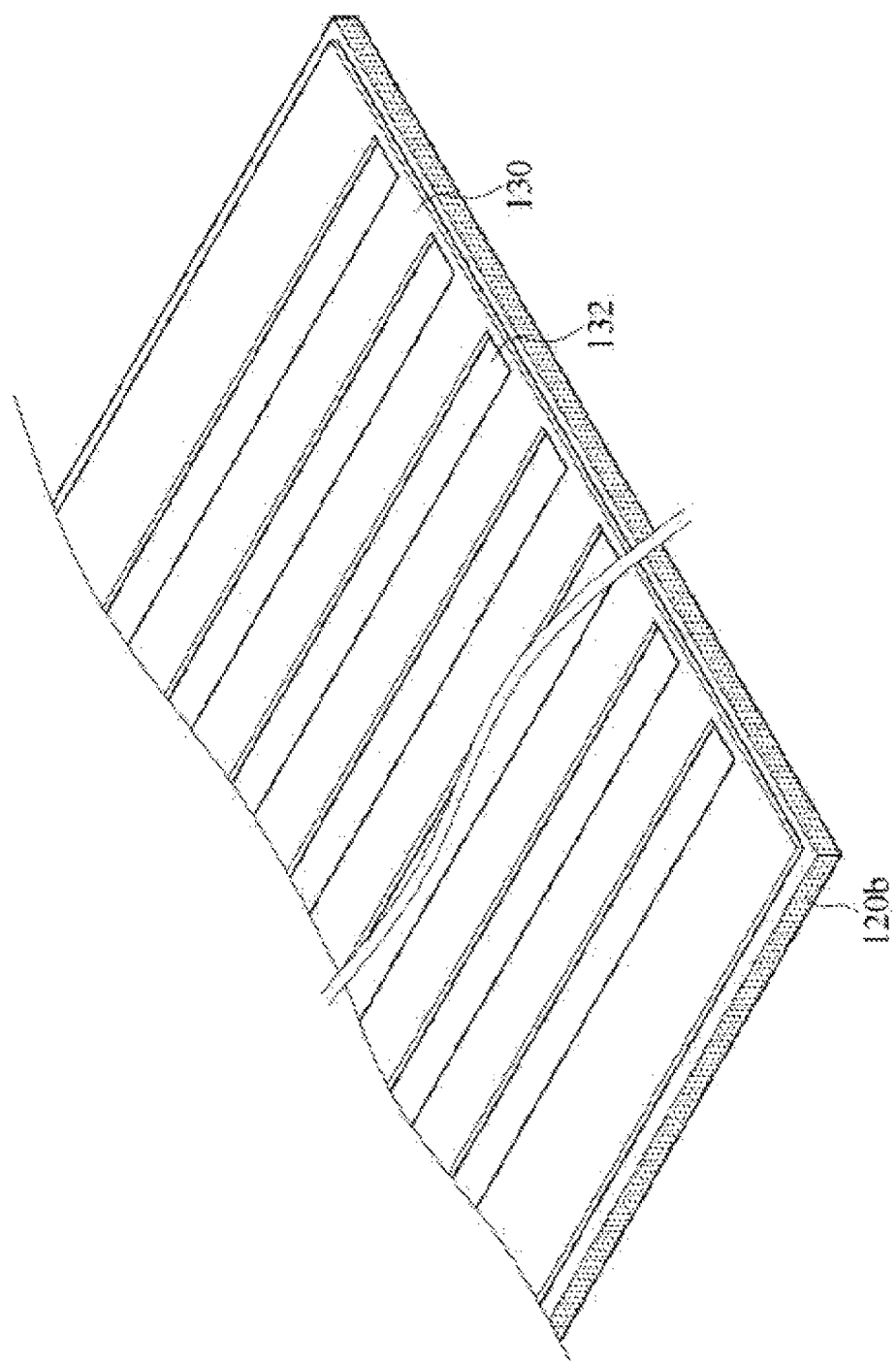
FIGS. 11A to 11E illustrate a manufacturing method of an LED filament according to a third embodiment of the present disclosure.
Figure 11B:
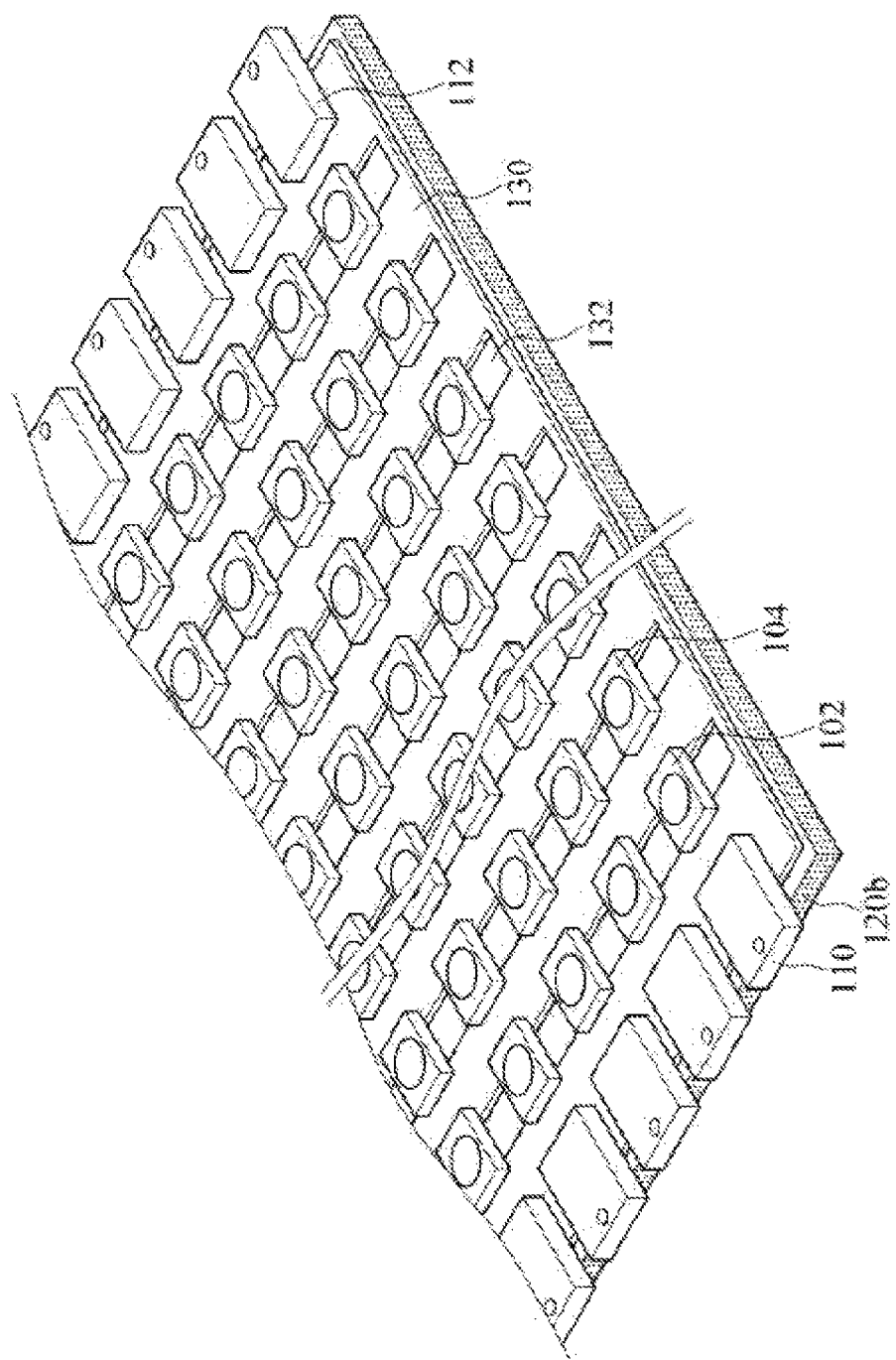
Figure 11C:
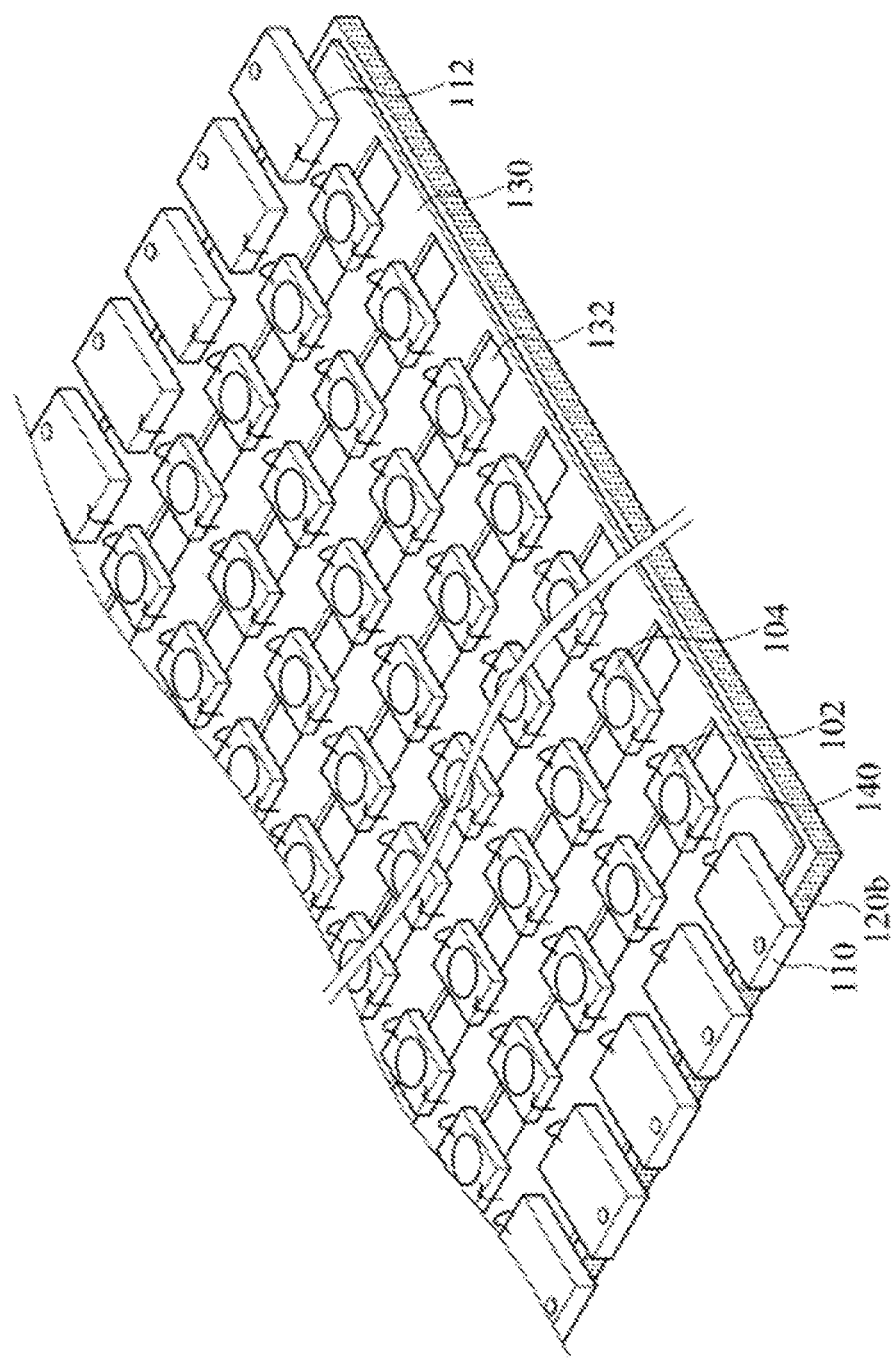

Next, please refer to FIGS. 11A to 11D which illustrate a manufacturing method of an LED filament according to a third embodiment. The manufacturing method for an Led filament 10*a* comprises:

S202: dispose conductive foil 130 on a light conversion sub-layer (base layer 120*b*), referring to FIG. 11A;

S204: dispose a plurality of LED chips 102, 104 and a plurality of conductive electrodes 110,112 on the conductive foil 130, referring to FIG. 11B;

S22: electrically connect the LED chips 102, 104 with the conductive electrodes 110, 112, referring to FIG. 11C; and S24: coat a light conversion sub-layer (top layer 120*a*) on the surfaces of the LED chips 102, 104 and the conductive electrode 110, 112 where are not in contact with the base layer 120*b*. The light conversion coating 120 (including the base layer 120*b* and the top layer 120*a*) coats on at least two sides of the LED chips 102, 104 and the conductive electrodes 110, 112. The light conversion coating 120 exposes a portion of at least two of the plurality of conductive electrodes 110, 112. The light conversion coating 120 comprises adhesive 122 and phosphors 124.

Please refer to FIG. 11A, the light conversion coating of S202 is called as the base layer 120*b*. The conductive foil 130 may have a plurality of openings 132. The width of each of the openings 132 may be lesser than the length of the LED chips 102, 104 and each of the openings 132 is aligned with the portion of the LED chips 102, 104 which emits light. Therefore, light emitted from LED may pass through the openings 132 without any shielding or blocking.

The conductive foil 130 may be, but not limited to, a copper foil coated with silver. The openings 132 may be formed by punching or stamping on a copper foil.

Before S202, the method may comprise a pre-step: dispose the base layer 120*b* on a carrier (like 180 of FIG. 10) or on a work table.

In S204, please refer to FIG. 11B. The LED chips 102, 104 and the conductive electrodes 110, 112 are disposed on the conductive foil 130. As above-mentioned, the light emitting portions of the LED chips 102, 104 are better to align with the openings 132.

Please refer to FIG. 11C. The electrical connection of S22 may be accomplished by wire bonding process like that shown in FIG. 1. As shown in FIG. 11C, the LED chips 102, 104 and the conductive electrodes 110, 112 are electrically connected together in series.

Figure 11D:
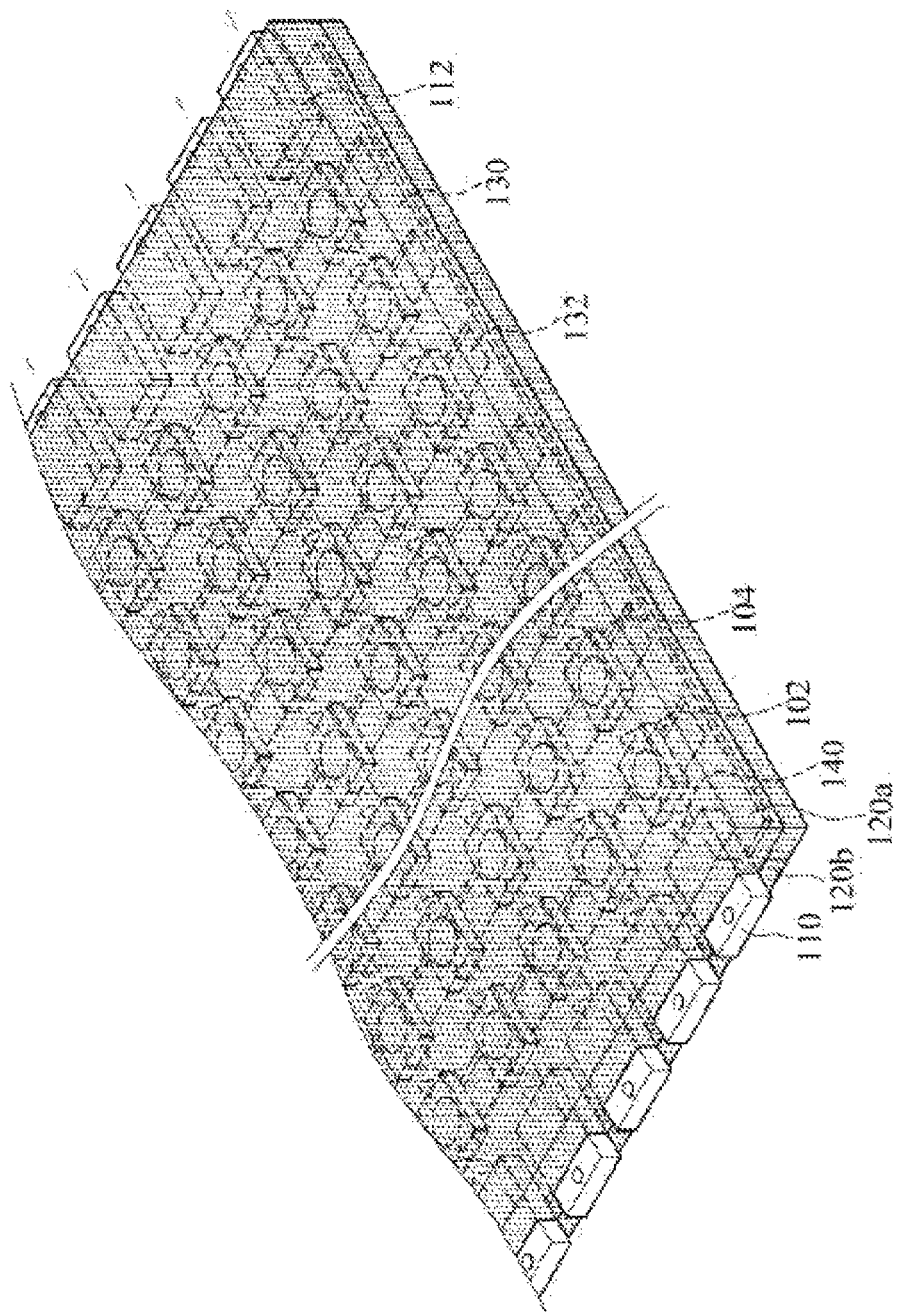

Next, please refer to FIG. 11D. Like the embodiment of FIG. 10, the light conversion sub-layer may be referred to top layer 120*a*. The top layer 120*a* fills out the gaps among the LED chips 102, 104 and the conductive electrodes 110, 112 including the gaps under the LED chips 102, 104 and the openings 132.

Regarding the disposition of the top layer 120*a*, there are a few method to proceed with. The first one is to coat a mixture of the adhesive 122 and the phosphors 124 on the LED chips 102, 104 and the conductive electrodes 110, 112. The second one is to firstly coat a layer of adhesive 122 on the LED chips 102, 104 and the conductive electrodes 110, 112, and secondly coat a layer of phosphors 124 on the layer of the adhesive 122 (two disposition steps). Thereafter, cure the layer of adhesive 122 and the layer of phosphors 124. The third one is to repeat the above two disposition steps until a required thickness is reached. Thereafter, a curing process is proceeded with. In comparison with the three methods, the uniformity of the light conversion coating 120 done by the third method might be better. Additionally, the disposition (coat) of the adhesive 122 or the phosphors 124 may be done by spraying.

Figure 11E:
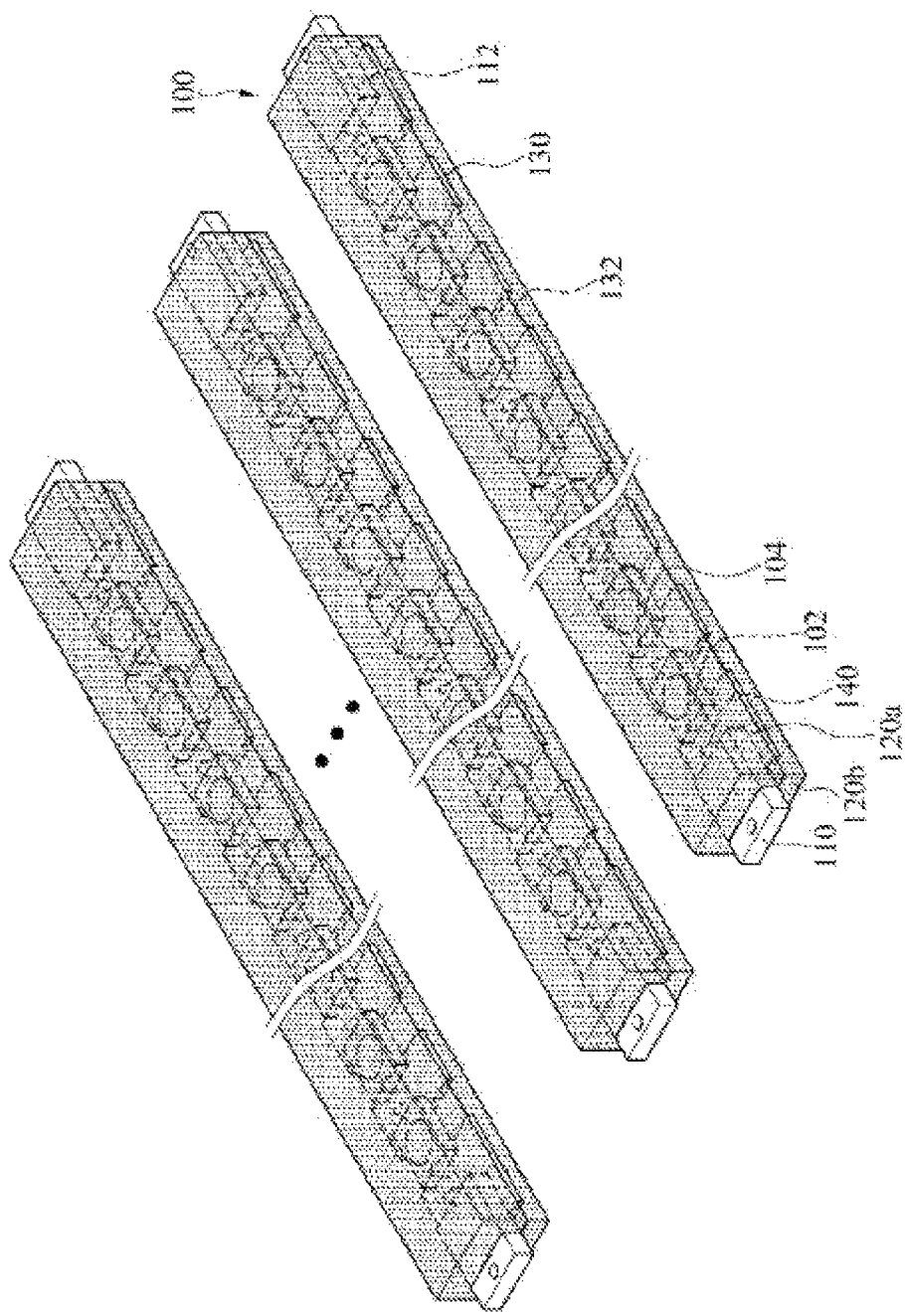

After S24, a cut process may be proceeded with, referring to FIG. 11E. Cut LED filaments 100 are manufactured as shown in FIG. 11E.

In accordance with the embodiment of FIGS. 11A to 11E, the LED chips 102, 104 and the conductive electrodes 110, 112 are electrically connected together through conductive foil 130 and conductive wire 140. The flexibility of the electrical connections is enhanced. Accordingly, when the LED filament 100 is bent, the electrical connections would not be easily broken.

Figure 12B:
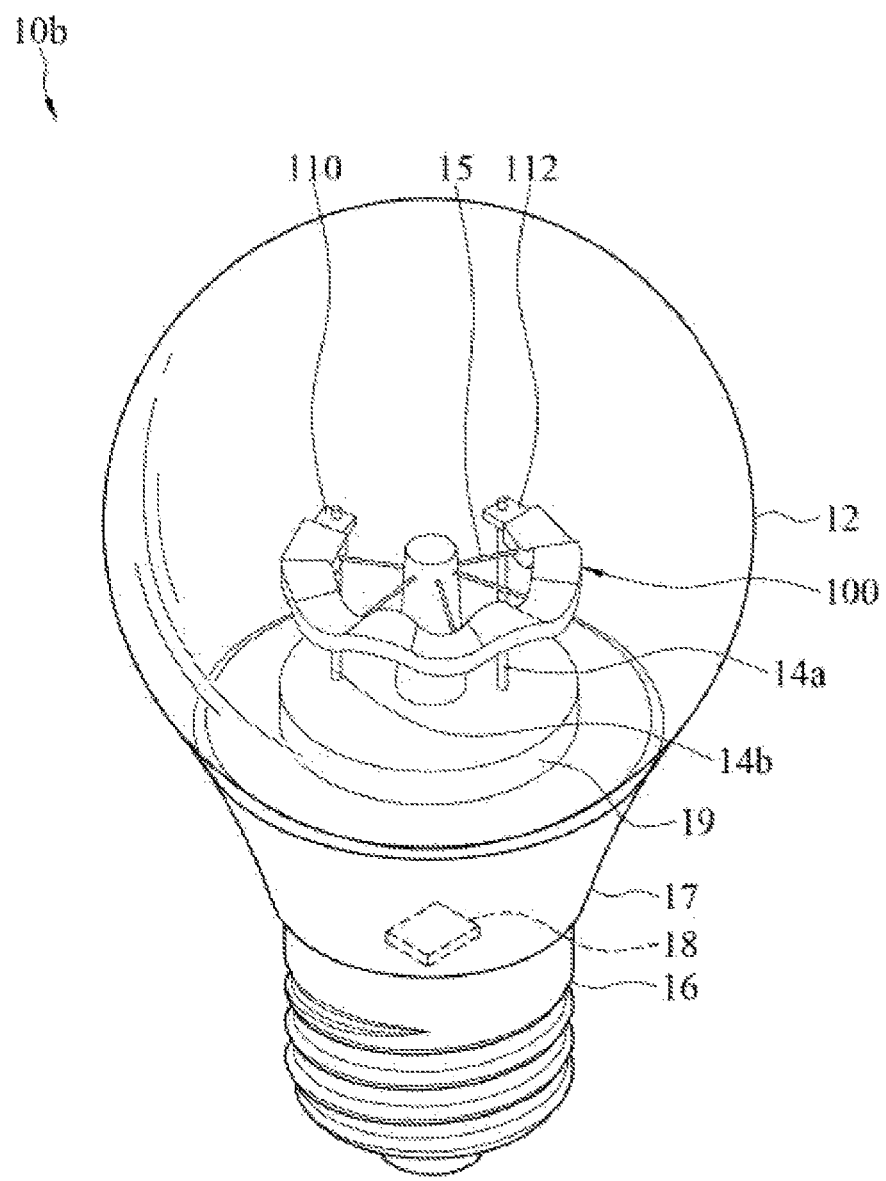

Please refer to FIGS. 12A and 12B which illustrate a perspective view of LED light bulb applying the LED filaments according to a first and a second embodiments. The LED light bulb 10*a*, 10*b* comprises a bulb shell 12, a bulb base 16 connected with the bulb shell 12, at least two conductive supports 14*a*, 14*b* disposed in the bulb shell 12, a driving circuit 18 electrically connected with both the conductive supports 14*a*, 14*b* and the bulb base 16, and a single LED filament 100.

The conductive supports 14a, 14b are used for electrically connecting with the conductive electrodes 110, 112 and for supporting the weight of the LED filament 100.

The bulb base 16 is used to receive electrical power. The driving circuit 18 receives the power from the bulb base 16 and drives the LED filament 100 to emit light. Due that the LED filament 100 emits light like the way a point light source does, the LED bulb 10a, 10b may emit omnidirectional light. In this embodiment, the driving circuit 18 is disposed inside the LED light bulb. However, in some embodiments, the driving circuit 18 may be disposed outside the LED bulb.

The definition of the omnidirectional light depends upon the area the bulb is used and varies over time. The definition of the omnidirectional light may be, but not limited to, the following example. Page 24 of Eligibility Criteria version 1.0 of US Energy Star Program Requirements for Lamps (Light Bulbs) defines omnidirectional lamp in base-up position requires that light emitted from the zone of 135 degree to 180 degree should be at least 5% of total flux (lm), and 90% of the measured intensity values may vary by no more than 25% from the average of all measured values in all planes (luminous intensity (cd) is measured within each vertical plane at a 5 degree vertical angle increment (maximum) from 0 degree to 135 degree). JEL 801 of Japan regulates the flux from the zone within 120 degrees along the light axis should be not less than 70% of total flux of the bulb.

In the embodiment of FIG. 12A, the LED light bulb 10a comprises two conductive supports 14a, 14b. In an embodiment, the LED light bulb may comprise more than two conductive supports 14a, 14b depending upon the design.

The bulb shell 12 may be shell having better light transmittance and thermal conductivity; for example, but not limited to, glass or plastic shell. Considering a requirement of low color temperature light bulb on the market, the interior of the bulb shell 12 may be appropriately doped with a golden yellow material or a surface inside the bulb shell 12 may be plated a golden yellow thin film for appropriately absorbing a trace of blue light emitted by a part of the LED chips 102, 104, so as to downgrade the color temperature performance of the LED bulb 10a, 10b. A vacuum pump may swap the air as the nitrogen gas or a mixture of nitrogen gas and helium gas in an appropriate proportion in the interior of the bulb shell 12, so as to improve the thermal conductivity of the gas inside the bulb shell 12 and also remove the water mist in the air. The air filled within the bulb shell 12 may be at least one selected from the group substantially consisting of helium (He), and hydrogen (H2). The volume ratio of Hydrogen to the overall volume of the bulb shell 12 is from 5% to 50%. The air pressure inside the bulb shell may be 0.4 to 1.0 atm (atmosphere).

According to the embodiments of FIGS. 12A and 12B, each of the LED light bulbs 10a, 10b comprises a stem 19 in the bulb shell 12 and a heat dissipating element 17 between the bulb shell 12 and the bulb base 16. The LED filament 100 is connected with the stem 19 through the conductive supports 14a, 14b. The stem 19 may be used to swap the air inside the bulb shell 12 with nitrogen gas or a mixture of nitrogen gas and helium gas. The stem 19 may further provide heat conduction effect from the LED filament 100 to outside of the bulb shell 12. The heat dissipating element 17 may be a hollow cylinder surrounding the opening of the bulb shell 12, and the interior of the heat dissipating element 17 may be equipped with the driving circuit 18. The material of the heat dissipating element 17 may be at least one selected from a metal, a ceramic, and a plastic with a good thermal conductivity effect. The heat dissipating element 17 and the stem 19 may be integrally formed in one piece to obtain better thermal conductivity in comparison with the traditional LED light bulb whose thermal resistance is increased due that the screw of the bulb base is glued with the heat dissipating element.

Referring to FIG. 12A, the height of the heat dissipating element 17 is L1 and the height from the bottom of the heat dissipating element 17 to the top of the bulb shell 12 is L2. The ratio of L1 to L2 is from 1/30 to 1/3. The lower the ratio, the higher the cutoff angle of illumination of the light bulb. In other words, the lower ratio increases the higher light-emission angle and the light from the bulb is closer to omnidirectional light.

Please referring to FIG. 12B, the LED filament 100 is bent to form a portion of a contour and to form a wave shape. In order to appropriately support the LED filament 100, the LED light bulb 10b further comprises a plurality of supporting arms 15 which are connected with and supports the LED filament 100. The supporting arms 15 may be connected with the wave crest and wave trough of the waved shaped LED filament 100. In this embodiment, the arc formed by the filament 100 is around 270 degrees. However, in other embodiment, the arc formed by the filament 100 may be approximately 360 degrees. Alternatively, one LED light bulb 10b may comprise two LED filaments 100 or more. For example, one LED light bulb 10b may comprise two LED filaments 100 and each of the LED filaments 100 is bent to form approximately 180 degrees arc (semicircle). Two semicircle LED filaments 100 are disposed together to form an approximately 360 circle. By the way of adjusting the arc formed by the LED filament 100, the LED filament 100 may provide with omnidirectional light. Further, the structure of one-piece filament simplifies the manufacturing and assembly procedures and reduces the overall cost.

In some embodiment, the supporting arm 15 and the stem 19 may be coated with high reflective materials, for example, a material with white color. Taking heat dissipating characteristics into consideration, the high reflective materials may be a material having good absorption for heat radiation like graphene. Specifically, the supporting arm 15 and the stem 19 may be coated with a thin film of graphene.

Figure 13A:
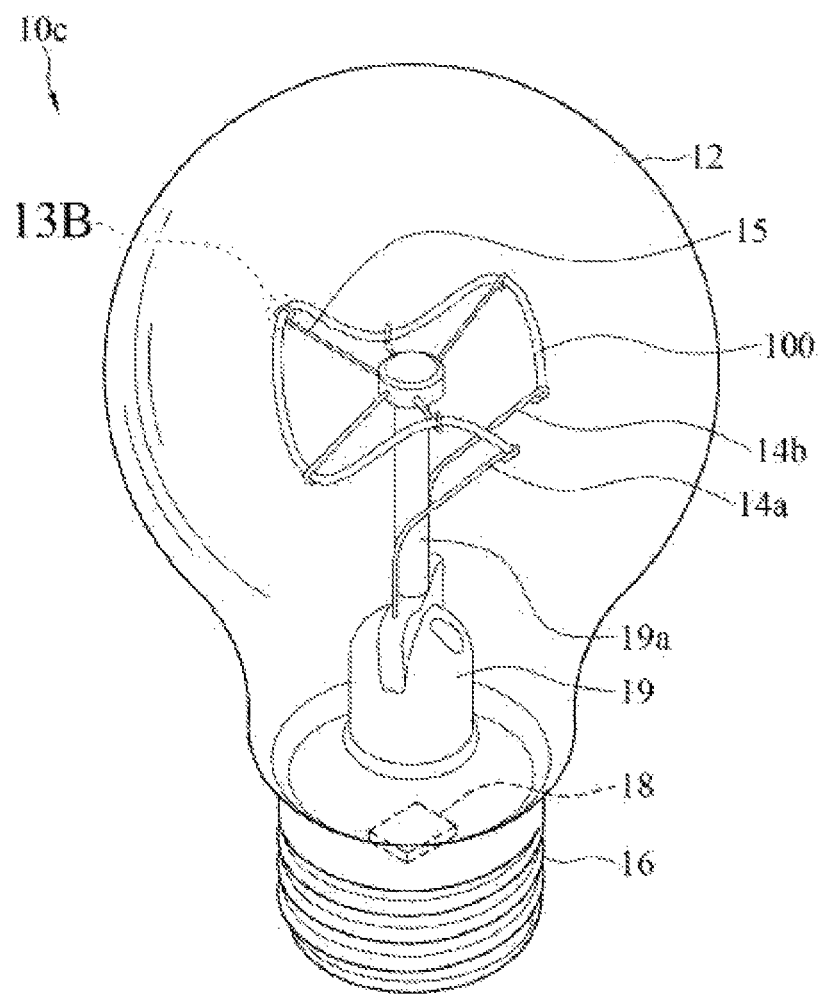
FIG. 13A illustrates a perspective view of an LED light bulb according to a third embodiment of the present disclosure.
Figure 14A:
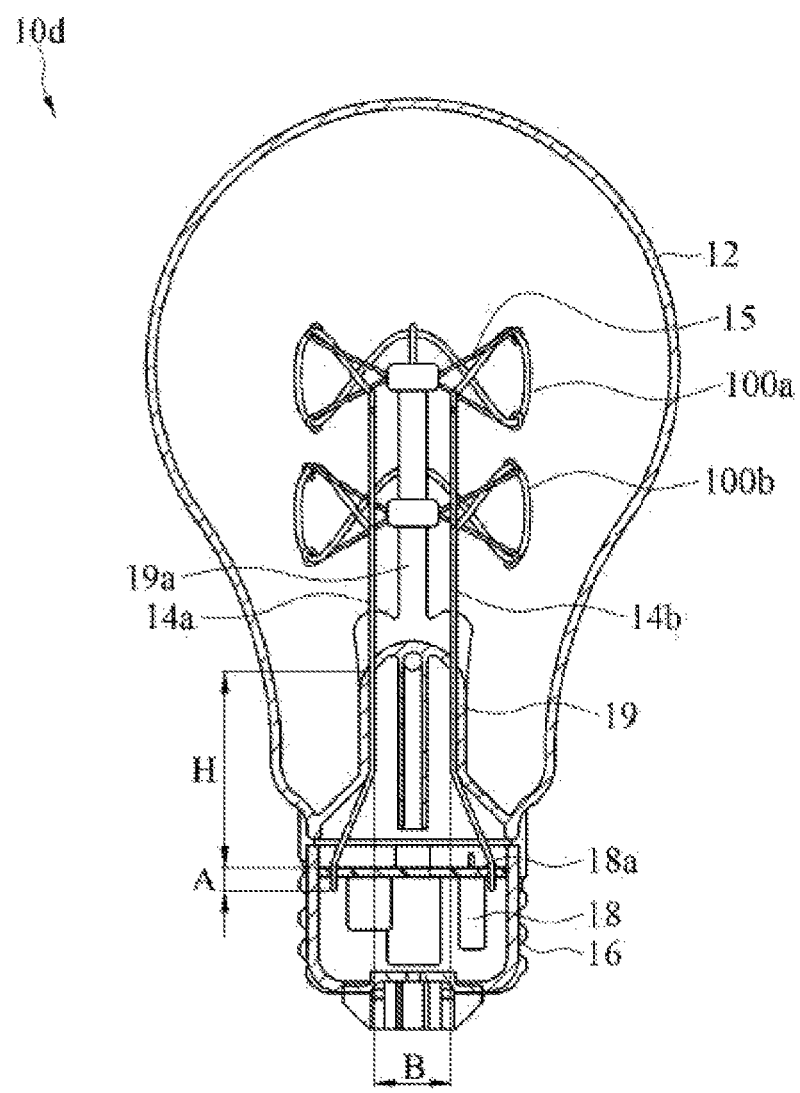
FIG. 14A illustrates a cross-sectional view of an LED light bulb according to a fourth embodiment of the present disclosure.

Please refer to FIG. 13A and FIG. 14A. FIG. 13A illustrates a perspective view of an LED light bulb according to a third embodiment of the present disclosure. FIG. 14A illustrates a cross-sectional view of an LED light bulb according to a fourth embodiment of the present disclosure. According to the third embodiment, the LED light bulb 10c comprises a bulb shell 12, a bulb base 16 connected with the bulb shell 12, two conductive supports 14a, 14b disposed in the bulb shell 12, a driving circuit 18 electrically connected with both the conductive supports 14a, 14b and the bulb base 16, a stem 19, supporting arms 15 and a single LED filament 100. The LED light bulb 10d of the fourth embodiment is similar to the third embodiment illustrated in FIG. 13A and comprises two LED filaments 100a, 100b arranged at the different vertical level in FIG. 14A. The LED filaments 100a, 100b are bent to form a contour from the top view of FIG. 14A.

The cross-sectional size of the LED filaments 100, 100a, 100b is small than that in the embodiments of FIGS. 12A and 12B. The conductive electrodes 110, 112 of the LED filaments 100, 100a, 100b are electrically connected with the conductive supports 14a, 14b to receive the electrical power from the driving circuit 18. The connection between the conductive supports 14a, 14b and the conductive electrodes 110, 112 may be a mechanical pressed connection or soldering connection. The mechanical connection may be formed by firstly passing the conductive supports 14a, 14b through the through holes 111, 113 (shown in FIG. 1 and secondly bending the free end of the conductive supports 14a, 14b to grip the conductive electrodes 110, 112. The soldering connection may be done by a soldering process with a silver-based alloy, a silver solder, a tin solder.

Similar to the first and second embodiments shown in FIGS. 12A and 12B, each of the LED filaments 100, 100a, 100b is bent to form a contour from the top view of FIGS. 13A and 14A. In the embodiments of FIGS. 13A, 14A, each of the LED filaments 100, 100a, 100b is bent to form a wave shape from side view. The shape of the LED filament 100 is novel and makes the illumination more uniform. In comparison with a LED bulb having multiple LED filaments, single LED filament 100 has less connecting spots. In implementation, single LED filament 100 has only two connecting spots such that the probability of defect soldering or defect mechanical pressing is decreased.

The stem 19 has a stand 19a extending to the center of the bulb shell 12. The stand 19 supports the supporting arms 15. The first end of each of the supporting arms 15 is connected with the stand 19a while the second end of each of the supporting arms 15 is connected with the LED filament 100, 100a, 100b. Please refer to FIG. 13B which illustrates an enlarged cross-sectional view of the dashed-line circle of FIG. 13A. The second end of each of the supporting arms 15 has a clamping portion 15a which clamps the body of the LED filament 100, 100a, 100b. The clamping portion 15a may, but not limited to, clamp at either the wave crest or the wave trough. Alternatively, the clamping portion 15a may clamp at the portion between the wave crest and the wave trough. The shape of the clamping portion 15a may be tightly fitted with the outer shape of the cross-section of the LED filament 100, 100a, 100b. The dimension of the inner shape (through hole) of the clamping portion 15a may be a little bit smaller than the outer shape of the cross-section of the LED filament 100, 100a, 100b. During manufacturing process, the LED filament 100, 100a, 100b may be passed through the inner shape of the clamping portion 15a to form a tight fit. Alternatively, the clamping portion 15a may be formed by a bending process. Specifically, the LED filament 100, 100a, 100b may be placed on the second end of the supporting arm 15 and a clamping tooling is used to bend the second end into the clamping portion to clamp the LED filament 100, 100a, 100b.

The supporting arms 15 may be, but not limited to, made of carbon steel spring to provide with adequate rigidity and flexibility so that the shock to the LED light bulb caused by external vibrations is absorbed and the LED filament 100 is not easily to be deformed. Since the stand 19a extending to the center of the bulb shell 12 and the supporting arms 15 are connected to the stand 19a, the position of the LED filaments 100 is at the level close to the center of the bulb shell 12. Accordingly, the illumination characteristics of the LED light bulb 10c are close to that of the traditional light bulb including illumination brightness. The illumination uniformity of LED light bulb 10c is better.

In the embodiment, the first end of the supporting arm 15 is connected with the stand 19a of the stem 19. The clamping portion of the second end of the supporting arm 15 is connected with the outer insulation surface of the LED filaments 100, 100a, 100b such that the supporting arms 15 are not used as connections for electrical power transmission. In an embodiment where the stem 19 is made of glass, the stem 19 would not be cracked or exploded because of the thermal expansion of the supporting arms 15 of the LED light bulb 10c.

Figure 13B:
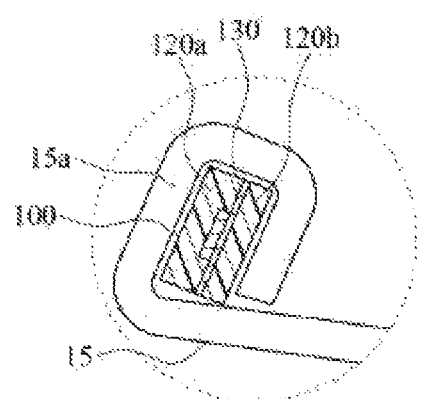
FIG. 13B illustrates an enlarged cross-sectional view of the dashed-line circle of FIG. 13A.

Since the inner shape (shape of through hole) of the clamping portion 15a fits the outer shape of the cross-section of the LED filament 100, the orientation of the cross-section of the LED filament 100, if necessary, may be properly adjusted. As shown in FIG. 13B, the top layer 120a is fixed to face around ten o'clock direction such that illumination surfaces of the LED filament 100 are facing substantially the same direction.

Figure 14B:
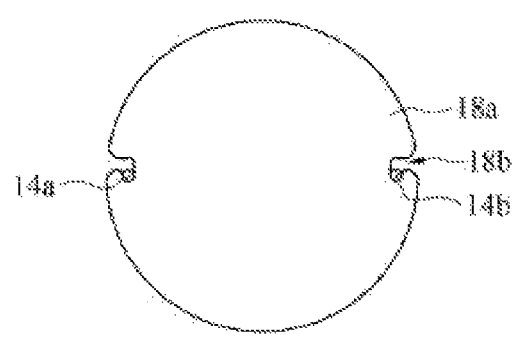
FIG. 14B illustrates the circuit board of the driving circuit of the LED light bulb according to the fourth embodiment of the present disclosure.

Please refer to FIG. 14B which illustrates the circuit board of the driving circuit of the LED light bulb from the top view of FIG. 14A according to the fourth embodiment of the present disclosure. The driving circuit 18 comprises a circuit board 18a which is fixed to the bulb base 16. The conductive supports 14a, 14b are electrically connected with the circuit board 18a and passes through the stand 19a to be electrically connected with the conductive electrodes 110, 112 of the LED filament 100a, 100b. The circuit board 18a comprises notches 18b. The notches 18b are of hook shape. The size of the tip of the notches 18b is slightly smaller than that of the cross-section of the conductive supports 14a, 14b for fixing the conductive supports 14a, 14b. The tip of the notches 18b is beneficial to the soldering between the circuit board 18a and the conductive supports 14a, 14b.

In the embodiments of FIGS. 13A and 14A, the length of the conductive supports 14a, 14b is better to meet the below equation to prevent two conductive supports 14a, 14b from short circuit or to prevent the conductive supports 14a, 14b from unable to reach the circuit board 18a.

$$L = A + \infty(\llbracket (B-3.2) \rrbracket^2 + H^2)$$

Wherein, referring to FIG. 14A, 3.2 is the electricity safety spacing; L is the calculated length of the conductive supports 14a, 14b and its unit is mini-meter; A is the sum of the thickness of the circuit board 18a and the height of the portion of the conductive supports 14a, 14b exposed from the surface of the circuit board 18a; B is the horizontal distance between the two conductive supports 14a, 14b; and H is the height from the circuit board 18a to the point the conductive supports 14a, 14b enters the stem 19. The actual length of the conductive supports 14a, 14b may be, but not limited to, between 0.5 L and 2 L, and more particularly between 0.75 L and 1.5 L.

In the embodiment of FIG. 14A, the LED light bulb 10d has two LED filaments 100a, 100b disposed on different vertical levels. The conductive supports 14a, 14b for the upper LED filaments 100a has a length Z=L+Y. Y is the distance between the upper LED filament 100a and the lower LED filament 100b.

While the instant disclosure related to an LED filament and LED light bulb has been described by way of examples and in terms of the preferred embodiments, it is to be understood that the instant disclosure needs not be limited to the disclosed embodiments. For anyone skilled in the art, various modifications and improvements within the spirit of the instant disclosure are covered under the scope of the instant disclosure. The covered scope of the instant disclosure is based on the appended claims.

What is claimed is:

1. An LED light bulb, comprising:
   a bulb shell with a lower part and an upper part opposite to the lower part;
   a bulb base connected with the bulb shell;
   a heat dissipating element connected with the lower part of the bulb shell and the bulb base, wherein the height of the heat dissipating element is L1 and the maximum height from the heat dissipating element to the upper part of the bulb shell is L2, the ratio of L1 to L2 is from 1/30 to 1/3;
a stem disposed in the bulb shell and coated with a thin film of graphene; and
a single flexible LED filament disposed in the bulb shell, the flexible LED filament comprising:
a plurality of LED chips electrically connected to each other, the aspect ratio of the LED chips is 2:1 to 10:1;
at least two conductive electrodes respectively disposed corresponding to the plurality of LED chips, the conductive electrodes being electrically connected with the plurality of LED chips;
a light conversion coating comprising a top layer and a base layer, the top layer of the light conversion coating is disposed on at least two sides of each of the plurality of LED chips and the conductive electrodes;
two conductive supports, disposed in the bulb shell and electrically connected with the conductive electrodes; and
a driving circuit, electrically connected with the two conductive supports and the bulb base;
wherein the flexible LED filament further comprising a plurality of conductive wires electrically and correspondingly connected among the plurality of LED chips and the conductive electrodes, at least one of the plurality of conductive wires being of M shape.

2. The LED light bulb of claim 1, wherein the material of the heat dissipating element is selected from the group consisting of metal, ceramic, and plastic with a good thermal conductivity effect.

3. The LED light bulb of claim 2, wherein the heat dissipating element and the stem is integrally formed in one piece.

4. The LED light bulb of claim 1, wherein the cross-sectional outline of the flexible LED filament is rectangular, triangle, circle, ellipse or square.

5. The LED light bulb of claim 3, wherein the flexible LED filament further comprising a plurality of circuit films for electrically connected adjacent LED chips.

6. The LED light bulb of claim 5, wherein each of the circuit film comprises a thin film and a conductive circuit disposed on the thin film.

7. The LED light bulb of claim 6, wherein the conductive circuits are substantially parallel lines electrically connected with pads of adjacent LED chips.

8. The LED light bulb of claim 6, wherein the conductive circuits are crossover lines electrically connected with pads of adjacent LED chips.

9. The LED light bulb of claim 8, wherein the material of the conductive film is indium tin oxide (ITO), nano-silver plasma, metal grids, or nano-tubes.

10. An LED light bulb, comprising:
a bulb shell with a lower part and a upper part opposite to the lower part;
a bulb base connected with the bulb shell;
a heat dissipating element connected with the lower part of the bulb shell and the bulb base, wherein the height of the heat dissipating element is L1 and the maximum height from the heat dissipating element to the upper part of the bulb shell is L2, the ratio of L1 to L2 is from 1/30 to 1/3;
a stem disposed in the bulb shell; and coated with a thin film of graphene; and
a single flexible LED filament disposed in the bulb shell, the LED filament comprising:
a plurality of LED chips electrically connected to each other, the aspect ratio of the LED chips is 2:1 to 10:1;
at least two conductive electrodes respectively disposed corresponding to the plurality of LED chips, the conductive electrodes being electrically connected with the plurality of LED chips;
a light conversion coating comprising a top layer and a base layer, the top layer of the light conversion coating is disposed on at least two sides of each of the plurality of LED chips and the conductive electrodes;
a plurality of supporting arms, nonconductively connected with and supporting the flexible LED filament, each of the supporting arms comprises a first end and a second end, the first end of each is nonconductively connected with the stand while the second end is nonconductively connected with the flexible LED filament, the second end of each of supporting arms has a clamping portion, the flexible LED filament is bent into a wavy shape, and the clamping portions clamp a wave crest and a wave trough of the wavy shape;
two conductive supports, disposed in the bulb shell and electrically connected with the conductive electrodes; and
a driving circuit, electrically connected with the two conductive supports and the bulb base.

11. The LED light bulb of claim 10, wherein the arc formed by the LED filament is 270 degrees.

12. The LED light bulb of claim 11, wherein the Shore D Hardness of the base layer is at least 60 HD, the hardness of the base layer is higher than the hardness of the top layer.

13. The LED light bulb of claim 12, wherein the material of the heat dissipating element is selected from the group consisting of metal, ceramic, and plastic with a good thermal conductivity effect.

14. The LED light bulb of claim 13, wherein the heat dissipating element and the stem is integrally formed in one piece.

15. The LED light bulb of claim 14, wherein the cross-sectional outline of the flexible LED filament is rectangular, triangle, circle, ellipse or square.

16. The LED light bulb of claim 15, wherein the flexible LED filament further comprising a plurality of circuit films for electrically connected adjacent LED chips.

17. The LED light bulb of claim 16, wherein each of the circuit film comprises a thin film and a conductive circuit disposed on the thin film.

18. The LED light bulb of claim 17, wherein the conductive circuits are crossover lines electrically connected with pads of adjacent LED chips.

19. The LED light bulb of claim 18, wherein the material of the conductive film is indium tin oxide (ITO), nano-silver plasma, metal grids, or nano-tubes.

* * * * *